United States Patent
Liao et al.

(10) Patent No.: US 11,024,979 B2
(45) Date of Patent: Jun. 1, 2021

(54) 3D IC ANTENNA ARRAY WITH LAMINATED HIGH-K DIELECTRIC

(71) Applicant: Taiwan Semiconductor Manufacturing Co., Ltd., Hsin-Chu (TW)

(72) Inventors: Wen-Shiang Liao, Toufen Township (TW); Feng Wei Kuo, Zhudong Township (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 165 days.

(21) Appl. No.: 15/904,758

(22) Filed: Feb. 26, 2018

(65) Prior Publication Data
US 2019/0103680 A1    Apr. 4, 2019

Related U.S. Application Data

(60) Provisional application No. 62/565,171, filed on Sep. 29, 2017.

(51) Int. Cl.
*H01Q 21/00*        (2006.01)
*H01Q 13/10*        (2006.01)
(Continued)

(52) U.S. Cl.
CPC ..... *H01Q 21/005* (2013.01); *H01L 21/76841* (2013.01); *H01L 23/66* (2013.01);
(Continued)

(58) Field of Classification Search
CPC ...... H01Q 1/2283; H01Q 1/241; H01Q 1/242; H01Q 1/243; H01Q 1/244; H01Q 1/245;
(Continued)

(56) References Cited

U.S. PATENT DOCUMENTS

| | | | |
|---|---|---|---|
| 2014/0266919 A1* | 9/2014 | Chen | H01L 23/66 343/700 MS |
| 2017/0040711 A1* | 2/2017 | Rakib | H01Q 1/246 |
| 2017/0236776 A1* | 8/2017 | Huynh | H01L 23/3677 257/428 |

OTHER PUBLICATIONS

Kuo, et al. "A Fully SiP Integrated-Band Butler Matrix End-Fire Beam-Switching Transmitter Using Flip-Chip Assembled CMOS Chips on LTCC." IEEE Transactions on Microwave Theory and Techniques, vol. 60, No. 5, May 2012.
(Continued)

*Primary Examiner* — Binh B Tran
(74) *Attorney, Agent, or Firm* — Eschweiler & Potashnik, LLC

(57) ABSTRACT

The present disclosure relates to a semiconductor package device including a stacked antenna structure with a high-k laminated dielectric layer separating antenna and ground planes, and a method of manufacturing the structure. A semiconductor die is laterally encapsulated within an insulating structure comprising a first redistributions structure. A second redistribution structure is disposed over and electrically coupled to the first redistribution structure and the die. The second redistribution structure includes the stacked antenna structure which includes first and second conductive planes separated by a high dielectric constant laminated dielectric structure. The first conductive plane includes openings and the second conductive plane is configured to transmit and receive electromagnetic waves through the openings in the first conductive plane.

19 Claims, 15 Drawing Sheets

(51) Int. Cl.
  *H01Q 1/22* (2006.01)
  *H01L 21/768* (2006.01)
  *H01L 23/66* (2006.01)
  *H01Q 21/06* (2006.01)
  *H01Q 1/48* (2006.01)
  *H01Q 9/04* (2006.01)

(52) U.S. Cl.
  CPC ............ *H01Q 1/2283* (2013.01); *H01Q 1/48* (2013.01); *H01Q 13/106* (2013.01); *H01Q 21/0087* (2013.01); *H01Q 21/065* (2013.01); *H01L 2223/6655* (2013.01); *H01L 2223/6677* (2013.01); *H01L 2224/18* (2013.01); *H01Q 9/0407* (2013.01)

(58) Field of Classification Search
  CPC ........ H01Q 5/328; H01Q 9/285; H01Q 9/065; H01Q 13/106; H01Q 19/005; H01Q 21/005; H01Q 21/0062; H01Q 21/064; H01Q 21/065; H01Q 21/20; H01Q 21/24
  See application file for complete search history.

(56) References Cited

OTHER PUBLICATIONS

Jeong, et al. "High Performance Air Gap Transmission Lines for Millimeter Wace Applications." IEEE MTT-S Digest, 2002.
Koul, Shiban K. "Technologies for RF to Millimeter Wave Circuits." 2006 International RF and Microwave Conference Proceedings, Sep. 12-14, 2006, Putrajaya, Malaysia.
U.S. Appl. No. 15/590,348, filed May 9, 2017.
U.S. Appl. No. 15/705,501, filed Sep. 15, 2017.

* cited by examiner

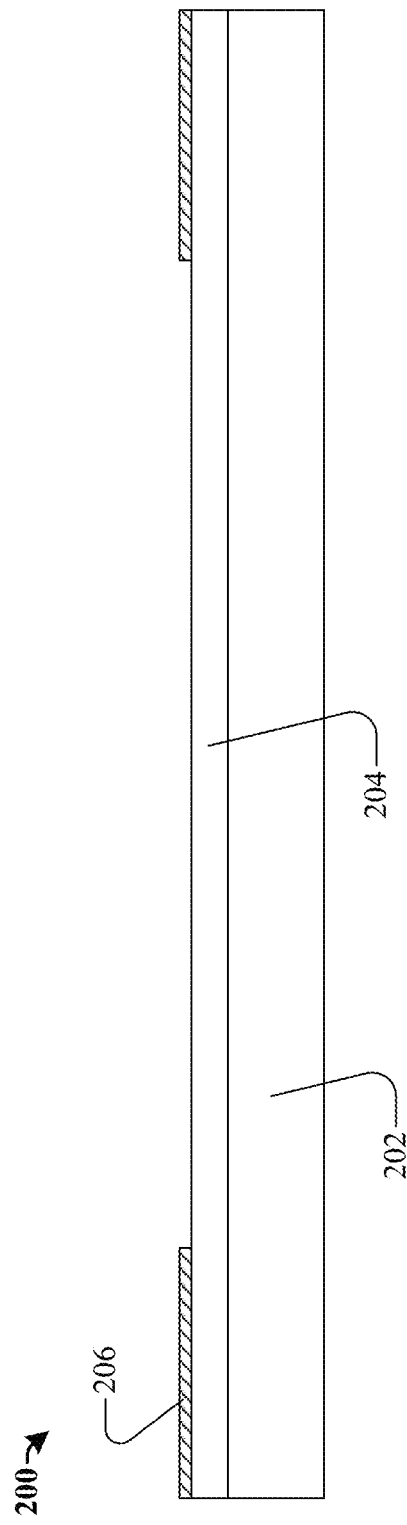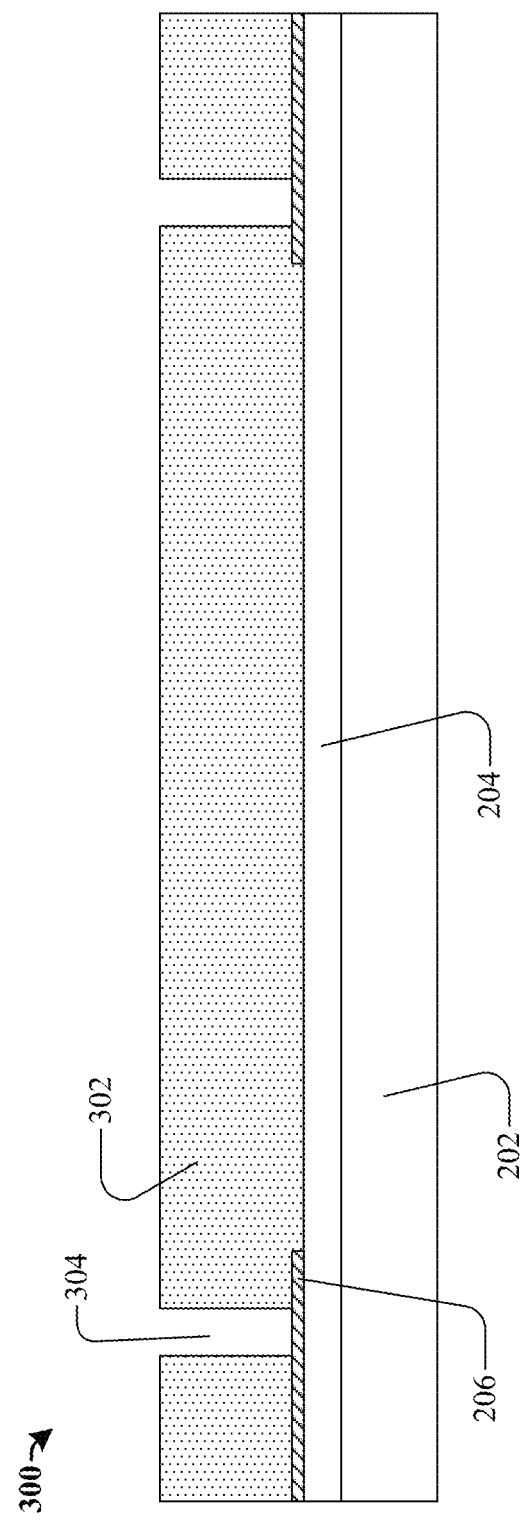

3D IC ANTENNA ARRAY WITH LAMINATED HIGH-K DIELECTRIC

REFERENCE TO RELATED APPLICATIONS

This Application claims priority to U.S. Provisional Application No. 62/565,171 filed on Sep. 29, 2017. The contents of the above-referenced matters are hereby incorporated by reference in their entirety.

BACKGROUND

Many modern day electronic devices comprise integrated chips that use antennas to communicate wirelessly with other electronic devices. Integrated chips can use conventional off-chip antennas, or on-chip integrated antennas. Off-chip antennas are external components connected to an integrated chip. On-chip integrated antennas are miniaturized and built within the integrated chip itself. For example, integrated antennas such as thin film micro-strip antennas or patch antennas used in high frequency wireless communication devices often use planar antenna arrays disposed on a high frequency substrate or high frequency printed circuit board.

Over the past decade there has been an increased demand for wireless communications in handheld devices including tablet PCs and smart phones and in consumer related devices such as guidance and safety systems for automobiles. Modern devices tend to be smaller, thinner, and lighter since physical size often determines the competitiveness of a product. Therefore, in modern devices, an antenna implemented with off-chip components may be disadvantageous due to the large area of the off-chip components and may also suffer from poor performance because of impedance mismatch between an integrated chip and the antenna. Further, existing on-chip antennas, while smaller than their off-chip counterparts, may also be larger than desired to fit today's demands for portable electronics. Thus, an improved integrated antenna structure is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-15 include cross-sectional views of intermediate structures for a method of manufacturing of a semiconductor package device configured according to some embodiments of the present disclosure, and comprising a stacked antenna array including a laminated high-k dielectric structure separating the ground plane and the antenna plane.

DETAILED DESCRIPTION

Figure 1A:
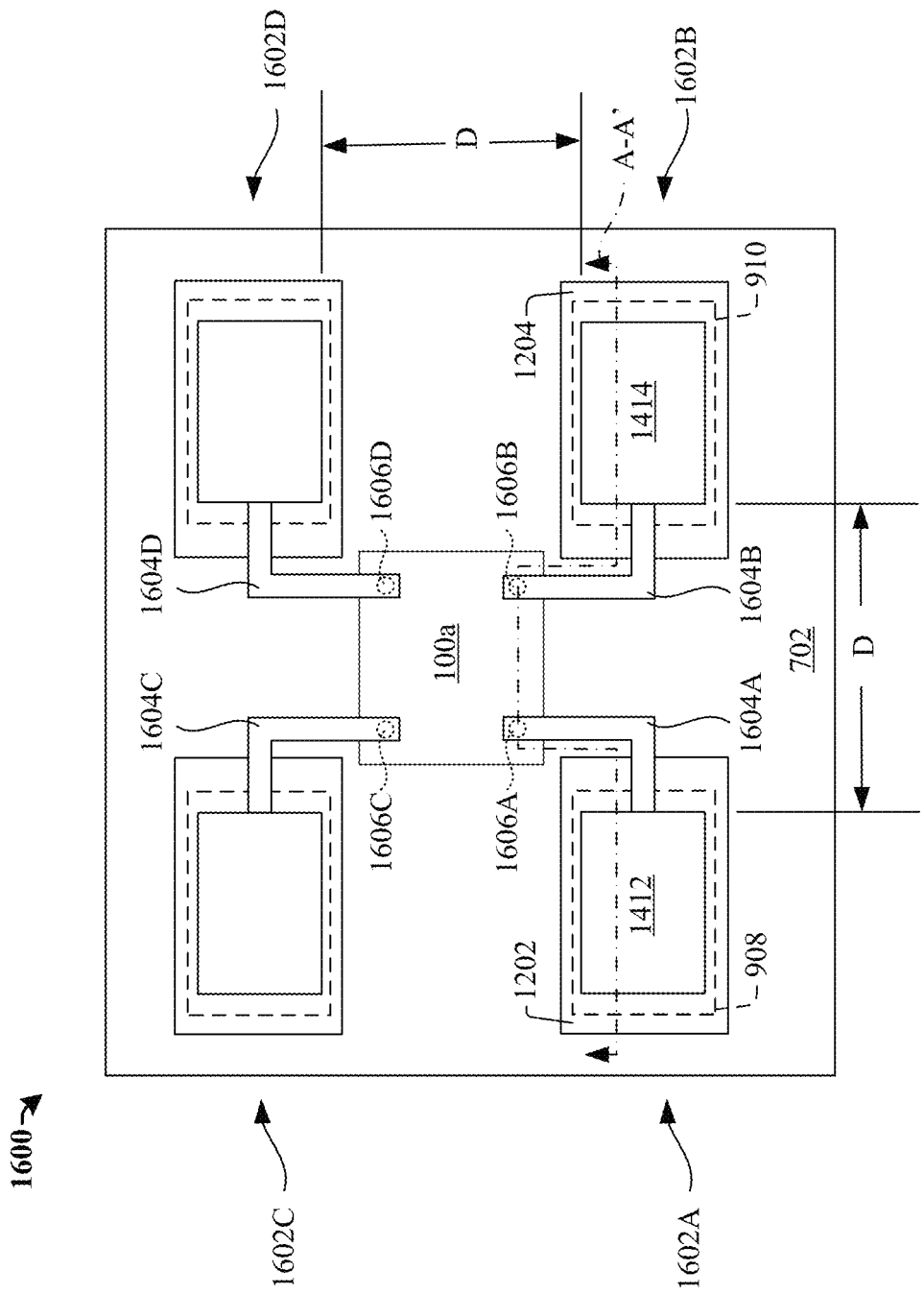
FIG. 1A illustrates a top view of an antenna structure in accordance with some embodiments.

The present disclosure provides many different embodiments or examples for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

The present disclosure provides various embodiments of a semiconductor package device with one or more integrated antenna structures, and its associated manufacturing operations. A device of this type is used for wireless communication devices for a variety of high volume commercial and consumer applications utilizing a spectrum around 60 GHz. These include high-speed short distance wireless personal area networks (WPANs), 5G networks, radar applications including automotive radar, and others including wearable electronics and smart phone applications. A highly-integrated system with an embedded antenna structure is desired in terms of reducing both device footprint and manufacturing cost. Additionally, the return loss and impedance match of the integrated antenna is better managed using modern semiconductor fabrication methods compared with earlier techniques. As a result, the proposed integrated antenna package can provide better radiation efficiency in gigahertz frequencies such as the 28 GHz to 77 GHz range, and can do so in a more compact form factor package compared to conventional packages.

To further reduce form factor, the integrated antenna structure according to the present disclosure may comprise a thin and laminated dielectric structure separating an antenna plane of the integrated antenna structure from a ground plane of the integrated antenna structure. The laminated dielectric structure comprises layer upon layer of selected high dielectric constant materials, each layer applied in a relatively thin film to minimize strain build up. By comparison, a conventional single material dielectric structure is generally thicker which risks high strain build-up leading to in-service failures, and introduces radiating efficiency losses due to surface wave excitation in the dielectric.

The present disclosure provides for an integrated stacked antenna structure that is located above and spaced apart from an underlying semiconductor die. The stacked antenna structure features a ground plane that is configured as a striped ground plane comprising an arrangement of slots or openings within the conductor material that comprises the ground plane. It will be appreciated that the slots or openings are not limited to "stripe" shapes, but may be patterned or have gaps and/or slots of various shapes, such as ring-shaped, oval-shaped, serpentine shaped, polygon-shaped, cross-hatched, etc. The antenna plane is configured to radiate and receive electromagnetic waves directed through the openings in the striped ground plane. By laterally offsetting the antenna structure and the striped ground plane from the underlying semiconductor die, the antenna's transmitting and receiving of electromagnetic waves occurs through a space of width S contained within the insulating structure, and avoids passing through the semiconductor die or other conductive features. In other words, no semiconductor dies or conductive features are present within the space width S. Such space width S is reserved as paths of transmission or reception of electromagnetic wave.

Further, the stacked antenna structure according to some embodiments of the present disclosure may also improve a reflection coefficient, the S11 parameter, of the integrated antenna, especially in high frequency applications of about 28 GHz and higher. As a result, the proposed antenna package can provide a better radiation efficiency in a GHz range, including a range between 28 GHz and 77 GHz, and can do so within a more compact foot print.

The embodiments described below provide many applicable concepts that can be embodied in a wide variety of specific contexts. The specific embodiments discussed are illustrative, and do not limit the scope of the disclosure.

Figure 1B:
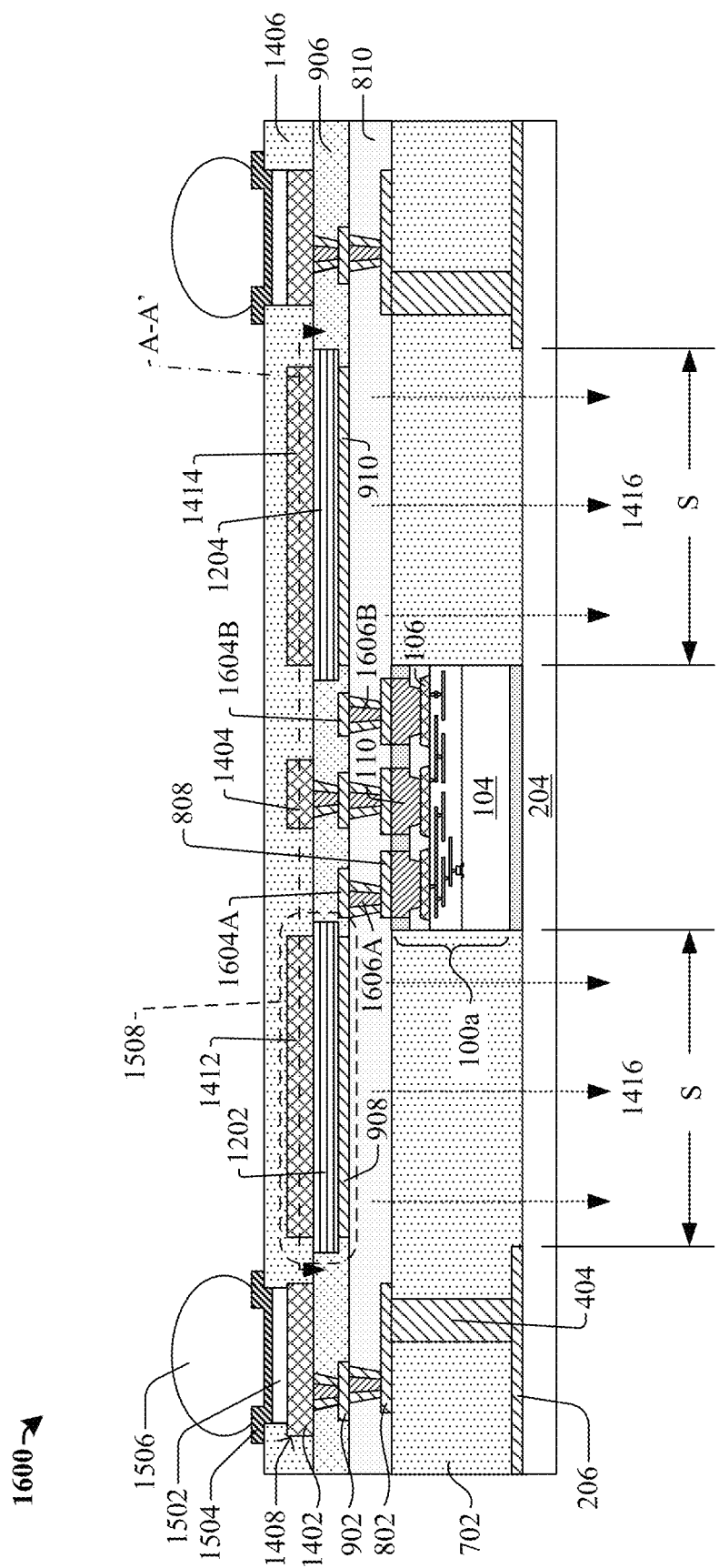
FIGS. 1B-1D each show a cross-sectional view of some embodiments of a semiconductor package device that includes a stacked antenna array and a laminated high-k dielectric structure.

FIG. 1A is a schematic top view of the semiconductor package device 1600 in accordance with some embodiments, and FIG. 1B is a corresponding cross-sectional view taken along A-A' of FIG. 1A. As illustrated, a semiconductor die 100a is electrically coupled to four branches 1602A through 1602D of a patch antenna array. For example, the first branch 1602A is comprised of a pair of conductive plates 1412 and 908 separated by a laminated dielectric structure 1202 (see also FIG. 1B's cross-section). The conductive plate 908 is shown in dash lines in FIG. 1A as it underlies the laminated dielectric structure 1202 when viewed from above. The second branch 1602B is comprised of a pair of conductive plates 1414 and 910 separated by a laminated dielectric structure 1204, the third and fourth branches 1602C and 1602D are configured similarly. It will be appreciated that discussion of some features in FIGS. 1A-1D and their corresponding reference numerals are omitted from the description of FIGS. 1A-1D for clarity, but are described later with respect to the cross-sectional views in FIGS. 2-15.

Laminated dielectric structures, such as 1202 and 1204, are disposed between corresponding pairs of conductive plates. Either conductive plate, for example 1412 or 908 with reference to 1602A, may be a ground plane or an antenna plane. In some embodiments, the ground plane is configured as a striped ground plane comprising openings for the antenna to transmit and receive electromagnetic waves through. The shapes of the aforesaid conductive plates or laminated dielectric structures have a rectangular shape in the present embodiment. However, other shapes are possible, e.g., a square shape, a circular shape, a polygonal shape or a strip shape. In some embodiments, in each of the antenna branches, the laminated dielectric structure 1202 or 1204 may have a surface area greater than a surface area of the overlaying or underlying conductive plate thereof. As a result, the electric field generated by the plates will be completely included within the laminated dielectric structure to achieve the desired radiation performance. In some embodiments, the laminated dielectric structure 1202 or 1204 may have a width greater than a width of the overlaying or underlying conductive plate thereof. In some embodiments, the laminated dielectric structure 1202 or 1204 may have geometry of 5 mm×5 mm. In some embodiments, the conductive plate of each antenna branch may have geometry of 950 µm×950 µm. In some embodiments, in each of the antenna branches, the ground plane may have a surface area greater than surface areas of the antenna plane and the laminated dielectric structure.

In some embodiments, the antenna branches 1602A through 1602D are arranged in an array, such as a square array. The semiconductor die 100a may be placed at a center of the array. As far as millimeter wave applications, the distance between the adjacent branches of the antenna is usually small, and is suitable to be integrated with a semiconductor package device. For example, a radio frequency (RF) communication band of 60 GHz for some applications, such as car radar, may be specified. Accordingly, the half wavelength of such RF wave will be about 2500 µm. As a result, the distance D between two adjacent branches, e.g., adjacent branches 1602A and 1602B or adjacent branches 1602A and 1602C, is about 2500 µm. Such arrangement can help generation of constructive interference from various antenna branches, thus enhancing the radiation efficiency. In some embodiments, the overall width of a patch antenna measured from side to side, or the distance D between adjacent branches, is less than 3000 µm. In some embodiments, the distance D between adjacent branches is less than 2000 µm.

Still referring to FIGS. 1A and 1B, metal lines 1604A through 1604D electrically couple one component plate (e.g., an antenna plane) of each of the four pairs of conductive plates. The metal lines 1604A through 1604D are configured as signal feed lines for delivery signal powers between the antenna planes and the semiconductor die 100a. In some embodiments, the metal lines 1604A through 1604D may extend into different ReDistribution Layers (RDLs) 802, 902, and 1402 (see FIG. 1B) and may have meandering shapes. It can be observed that each metal line 1604A through 1604D within RDL layer 802 extends mostly over the insulating material 702 viewed from above as shown in FIG. 1A, except for the contact portion connecting to the respective pads on the semiconductor die 100a. Additionally, the metal lines 1604A through 1604D are further surrounded by Inter-Metal Dielectrics (IMDs) 810, 906, or 1406. Thus, horizontal portions of the metal lines 1604A through 1604D run in a path encapsulated by dielectric materials (e.g., IMD or insulating material) rather than any conductive or semiconductor materials. Moreover, most vertical vias joining the aforesaid horizontal portions, such as vias 1606A-1606D, are also included in the IMD 810, 906, or 1406. Thus, the signal loss attributed to the horizontal portions is reduced significantly.

In conventional designs, by contrast, existing signal feed lines are usually disposed close to the substrate 104 of the semiconductor die 100. In some cases, the feed line is disposed in a layer between the conductors 110 and the connection terminals. The short gap between the feed line and the semiconductor material of the substrate 104 causes noticeable signal transmission loss through the substrate 104. In the proposed framework, the metal lines 1604A through 1604D serve as feed lines and are disposed far above the substrate 104, and within the intervening RDL 802, 902, or 1402, from a vertical viewpoint. Also, the feed lines 1604A through 1604D are laterally distant from the substrate 104 from a horizontal viewpoint. The resulting signal loss can be reduced accordingly.

Figure 1C:
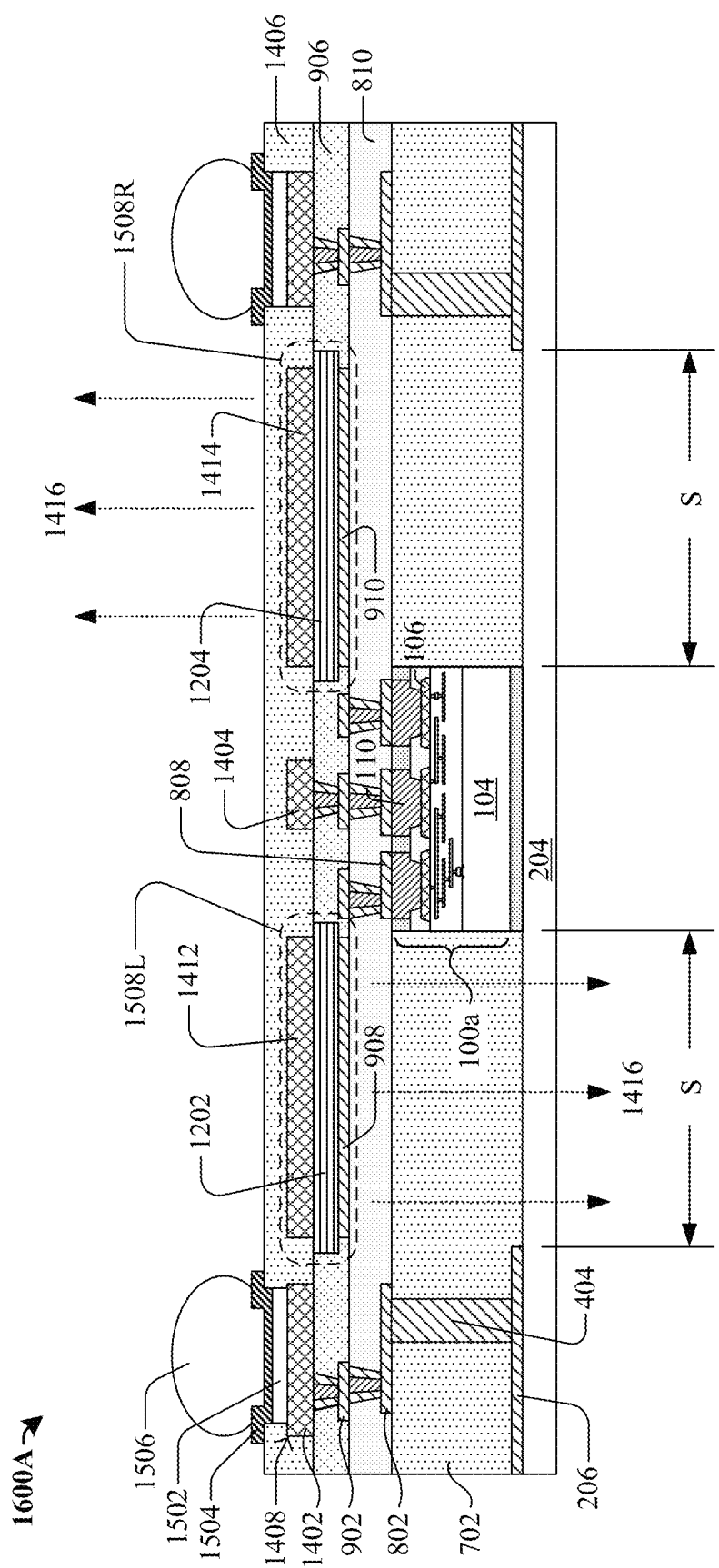

Referring now to FIG. 1B and FIG. 1C, cross-sectional views of a semiconductor package device in accordance with some embodiments are illustrated. The antenna plane and the ground plane may be interchanged within the antenna structure 1508 which comprises, for example, the conductive plates 908 and 1412 separated by the laminated dielectric structure 1202. In FIG. 1B, the antenna plates are depicted by the conductive plates 1412 and 1414, and striped ground planes are depicted by the conductive plates 908 and 910. The dotted lines shown in FIG. 1B signify that the radiation and reception direction 1416 is downward for both antenna structures 1508 and propagates through the insulating material 702. By this arrangement, electromagnetic waves can be radiated to or received from below the semiconductor package device through spaces S of the insulating material 702 and the RDL 802. The spaces S of the insulating material 702 or RDL 802 do not contain any semiconductor or conductive features, thus allowing the electromagnetic wave to pass through with minimized distortion.

Similarly, the left and right antenna structures can be configured to both radiate and receive in an upward direction (not shown). This is accomplished by selecting which of the paired conductive planes, for example 908 paired with 1412, functions as an antenna and which functions as a ground plane including a striped ground plane, and configuring the semiconductor package device 1600 accordingly.

FIG. 1C illustrates an embodiment 1600A where the antenna structures 1508 on the two sides of the semiconductor die 100a have different configurations leading to different transmission and reception directions. Referring to FIG. 1C, the antenna planes are designated as 1412 and 910 and radiate through openings in their respectively paired striped ground planes 908 and 1414. In this fashion, the left hand antenna structure 1508L radiates and receives in a downward direction toward the insulating material 702, and the right hand antenna structure 1508R radiates and receives in an upward direction away from the insulating material 702. Such a configuration assists in expanding the coverage of antenna radiation and reception and can improve the system performance.

Figure 1D:
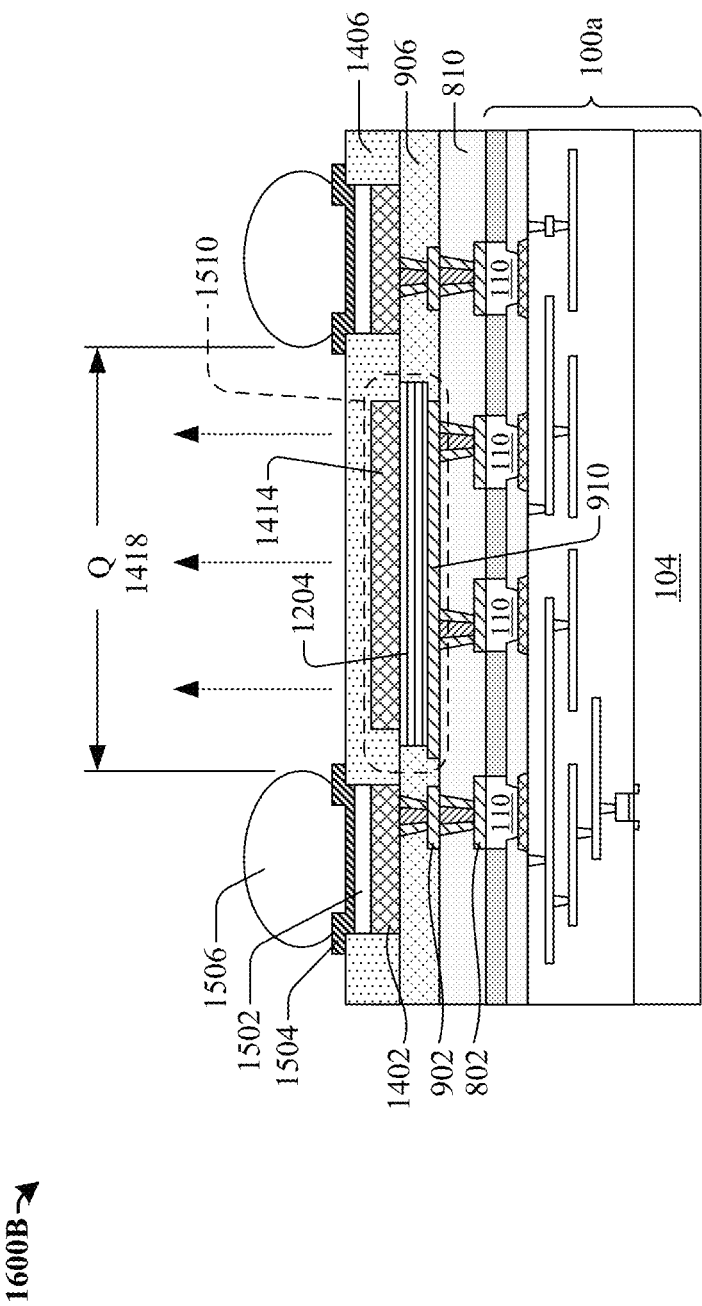

FIG. 1D is a schematic cross-sectional view of a semiconductor package device 1600B, in accordance with some embodiments of the present disclosure. The semiconductor package device 1600B adopts a fan-in structure wherein the RDLs 802, 902 and 1402 have sidewalls whose outer perimeter resides within an outer perimeter defined by edges of the semiconductor die 100a. The semiconductor package device 1600B includes a single antenna structure 1510 configured as a single antenna branch and comprised of the conductive plates 910 and 1414 and the laminated dielectric structure 1204. In this embodiment, the conductive plane 910 is configured as an antenna and is disposed under the laminated dielectric structure 1204. The striped ground plane 1414 is disposed over the laminated dielectric structure 1204. The antenna structure 1510 is configured to radiate or receive electromagnetic waves through a space Q between external connectors 1506, such as solder bumps or balls. The dotted lines signify that the antenna plane 910 radiates through openings in the striped ground plane 1414 and in a direction 1418 that faces away from the semiconductor die 100a.

FIGS. 2 through 15 include cross-sectional views of intermediate structures for further steps illustrating a method of manufacturing a semiconductor package device (e.g., semiconductor package device 1600 previously illustrated in FIG. 1A-1B), in accordance with various embodiments of the present disclosure. Initially, a carrier wafer 202 is provided as shown in FIG. 2. The carrier wafer 202 may comprise, for example, monocrystalline silicon, silicon based materials, such as glass, silicon oxide, aluminum oxide, ceramic materials, or combinations thereof. Next, a protection layer 204 is formed over the carrier wafer 202. The protection layer 204 may be formed of dielectric materials such as silicon oxide, silicon nitride, silicon oxynitride, or the like. In some embodiments, the protection layer 204 includes a polymeric material such as PI, PBO, BCB, epoxy, or the like.

A redistribution layer (RDL) 206 is formed over the protection layer 204. The RDL 206 is configured to electrically connect components of the semiconductor package device, such as the semiconductor die 100, with other layers. The RDL 206 may include multiple metal layers. Each of the metal layers may include conductive wires or lines and is electrically coupled to an adjacent overlaying or underlying metal layer through metal vias. In some embodiments, the metal layer of the RDL 206 is formed of conductive materials, such as copper, silver, aluminum, gold or tungsten. In some embodiments, the remaining portion of the RDL 206 may be filled with dielectric materials (not separately shown). The dielectric material may be formed of oxides, such as un-doped silicate glass (USG), fluorinated silicate glass (FSG), borophosphosilicate glass (BPSG), tetraethosiloxane (TEOS), spin-on glass (SOG), high-density plasma (HDP) oxide, plasma-enhanced TEOS (PETEOS), or the like. In some embodiments, several conductive pads (not separately shown) are disposed over the metal layer of the RDL 206. The metal layer of the RDL 206 may be connected to the conductive pads through an exposed top surface.

FIG. 3 illustrates the forming of a sacrificial layer 302 that is patterned using photolithography techniques. Generally, photolithography techniques involve masking, exposure, and development of a photoresist layer, which is often a layer over the sacrificial layer 302. After the photoresist layer is patterned over the sacrificial layer 302, an etching operation may be performed to remove unwanted portions of the sacrificial layer 302, thus leaving recesses 304.

Figure 4:
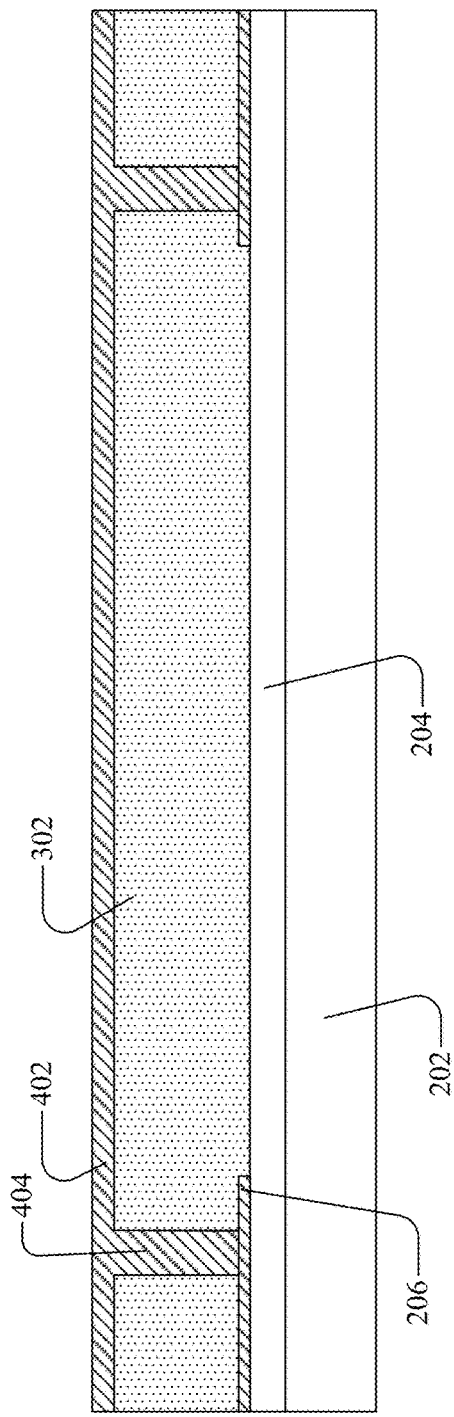

FIG. 4 illustrates the forming of one or more conductive pillars over the RDL 206. In subsequent processing steps, the conductive pillars become through insulator vias (TIV's) extending from the RDL 206 to an upper surface of an insulating layer encapsulating them. To form the conductive pillars, a conductive layer 402 is formed over the sacrificial layer 302, and in the process fills the recesses 304 to form the TIV's 404. Excess metal of the metal layer 402 further extends above an upper surface of the sacrificial layer 302.

Figure 5:
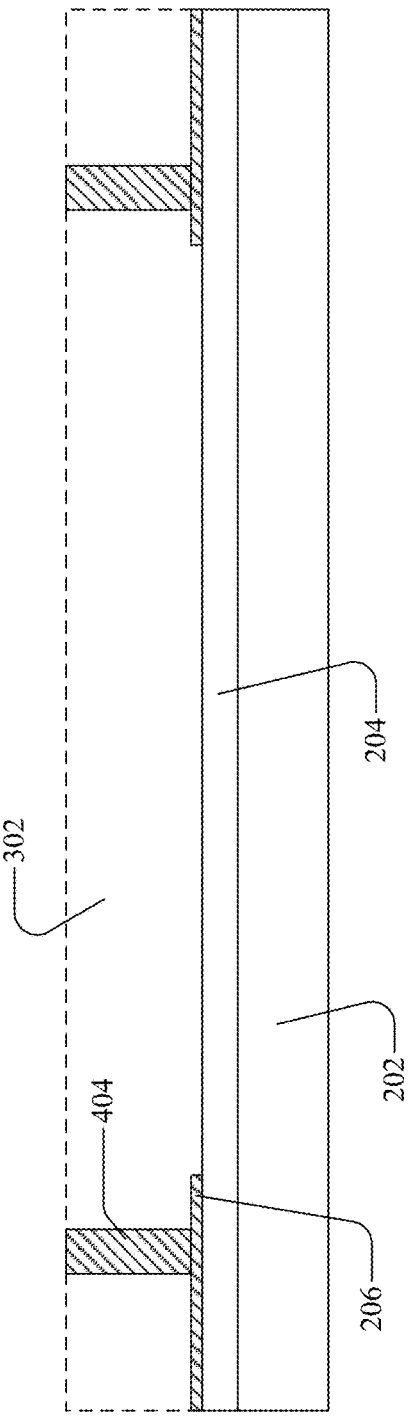

FIG. 5 illustrates the step of removing the excess metal layer by a chemical mechanical planarization (CMP) or other applicable process such that a top surface of sacrificial layer 302 is revealed and no excess metal exists over the photoresist layer 302. In the same CMP step, the top surfaces of the TIV's 404 are revealed. The sacrificial layer 302 is then chemically stripped or otherwise removed by, for example, by a selective etch, leaving the standing conductive pillars of the TIV's 404.

Figure 6:
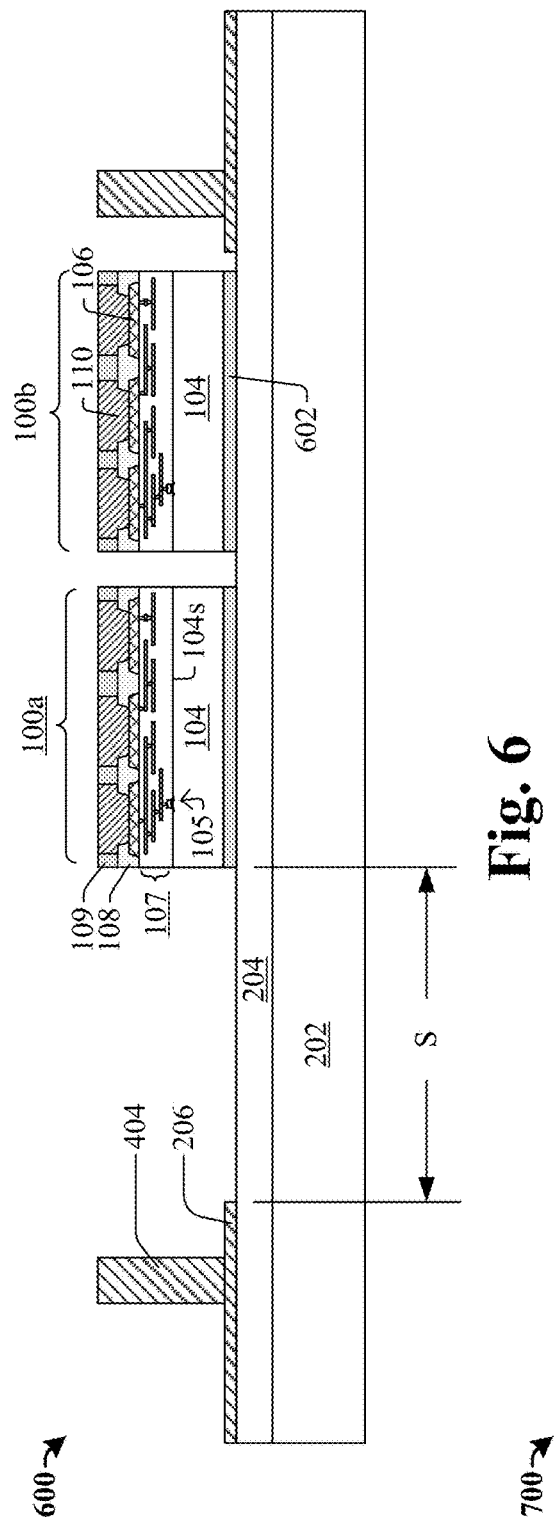

Referring to FIG. 6, semiconductor dies 100, in this case semiconductor dies 100a and 100b, are attached to the protection layer 204 and laterally spaced apart from the TIV's 404. In some embodiments, the semiconductor dies 100 are attached to the protection layer 204 through an adhesive layer 602. The adhesive layer 602 can be a die attach film (DAF), a dry film or a dicing tape. In some embodiments, a space S between one TIV 404 and a neighboring semiconductor die 100a is specified. In other words, no semiconductor dies or conductive features are present within the space S. Such space S is reserved as paths of transmission or reception of electromagnetic waves for the subsequently fabricated antenna structure.

The semiconductor die 100 may be a radio frequency integrated circuit (RFIC), a baseband transceiver die, a microprocessor die, a signal processing die, or combinations thereof.

The semiconductor die 100 comprises a substrate 104. The substrate 104 includes a semiconductor material, such as monocrystalline silicon. In some embodiments, the substrate 104 may include other semiconductor materials, such as silicon germanium, silicon carbide, gallium arsenide, or the like. The substrate 104 may be a p-type semiconductor substrate (acceptor type) or an n-type semiconductor substrate (donor type). Alternatively, the substrate 104 includes another elementary semiconductor, such as germanium; a compound semiconductor including silicon carbide, gallium arsenic, gallium phosphide, indium phosphide, indium arsenide, or indium antimonide; an alloy semiconductor including SiGe, GaAsP, AnnAs, AlGaAs, GaInAs, GaInP, or GaInAsP; or combinations thereof. In yet other embodiments, the substrate 104 is a semiconductor on-insulator (SOI). In other embodiments, the substrate 104 may include a doped epitaxial layer, a gradient semiconductor layer, or a semiconductor layer overlaying another semiconductor layer of a different type, such as a silicon layer on a silicon germanium layer.

Various components may be formed on a front surface (front side) 104s of the substrate 104. Examples of the components include active devices, such as transistors 105 and diodes, and passive devices, such as capacitors, inductors, and resistors. In addition, the semiconductor die 100 comprises one or more connection terminals 106, also referred to as conductive pads or bond pads. The components of the substrate 104 are electrically coupled to external circuits or devices through an interconnect structure 107 and the connection terminals 106. The interconnect structure 107 includes a plurality of metal wires (e.g., lines) which are stacked over one another and which pass through a dielectric material. The metal wires are connected to one another by vias, and operably couple the components in the substrate 104 to one another and to the connection terminals 106.

A dielectric layer 108 or a passivation layer is deposited to fill the gaps between the connection terminals 106. The dielectric layer 108 may be provided by initially forming a blanket dielectric material through a suitable process, such as chemical vapor deposition (CVD), physical vapor deposition (PVD), atomic layer deposition (ALD), or the like. Later, a photoresist (not separately shown) is formed over the blanket material. Patterning operations, such as lithographic and etching methods, are performed on the photoresist layer to expose the connection terminals 106. Excessive portions of the dielectric material are removed, resulting in the shaping of the dielectric layer 108 as desired. The dielectric layer 108 may be formed with a variety of dielectric materials and may, for example, be an oxide (e.g., Ge oxide), an oxynitride (e.g., GaP oxynitride), silicon dioxide (SiO$_2$), a nitrogen bearing oxide (e.g., nitrogen bearing SiO$_2$), a nitrogen-doped oxide (e.g., N$_2$-implanted SiO$_2$), silicon oxynitride (Si$_x$O$_y$N$_z$), a polymer material, or the like.

Moreover, a conductive layer is deposited on the connection terminal 106 and then patterned to form conductors 110 over the respective connection terminals 106. Materials of the conductors 110 include, for example, titanium (Ti), tantalum (Ta), titanium nitride (TiN), tantalum nitride (TaN), copper (Cu), copper alloys, nickel (Ni), tin (Sn), gold (Au), and combinations thereof. In some embodiments, the conductors 110 comprise a layered structure comprising different conductive sublayers.

A dielectric material 109 is formed to surround the conductors 110. In some embodiments, the dielectric material 109 may be aligned with edges of the semiconductor die 100. In some embodiments, the dielectric material may be comprised of silicon oxide, silicon nitride, silicon oxynitride, or the like. In some embodiments, the dielectric material 109 includes a polymeric material such as polyimide (PI), polybenzoxazole (PBO), benzocyclobuten (BCB), epoxy, or the like. The dielectric material 109 may be formed using a CVD, PVD, or other suitable operation. In some embodiments, a planarization operation, such as grinding or chemical mechanical polishing (CMP), may be performed to remove excess portions of the dielectric material 109 and level the dielectric material 109 with the conductors 110.

Figure 7:
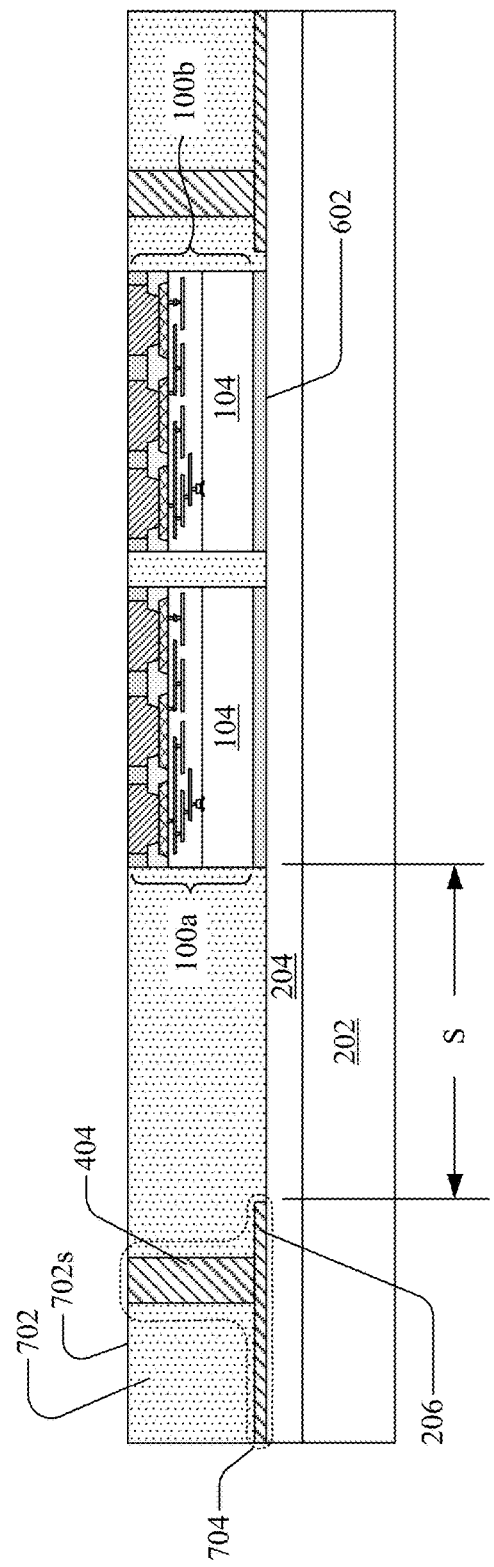

FIG. 7 shows the step of forming of an insulating material 702 over the protection layer 204, the sidewalls of the semiconductor dies 100a and 100b, the adhesive layer 602 and the TIV's 404. The insulating material 702 fills gaps between the semiconductor dies 100a and 100b and the TIV's 404. In some embodiments, the insulating material 702 fills the space S. The insulating material 702 may be a molding compound such as molding underfill, resin, PI, polyphenylene sulphide (PPS), polyether ether ketone (PEEK), polyethersulfone (PES), a heat resistant crystal resin, or combinations thereof. In some embodiments, the insulating material 702 may be formed with a variety of dielectric materials and may, for example, be ceramic, glass, silicon nitride, oxide (e.g., Ge oxide), oxynitride (e.g., GaP oxynitride), silicon dioxide (SiO$_2$), nitrogen-bearing oxide (e.g., nitrogen-bearing SiO$_2$), nitrogen-doped oxide (e.g., N$_2$-implanted SiO$_2$), silicon oxynitride (Si$_x$O$_y$N$_z$), or the like. In some embodiments, the insulating material 702 may be a polymeric material such as PBO, BCB, or any other suitable material.

The insulating material 702 may be formed by a variety of techniques, e.g., CVD, low-pressure CVD (LPCVD), plasma-enhanced CVD (PECVD), high density plasma CVD (HDPCVD), sputtering and physical vapor deposition, thermal growing, or the like. In some embodiments, a planarization operation, such as grinding or chemical mechanical polishing (CMP) methods may be utilized to level the upper surface of the insulating material 702 with the upper surfaces of the semiconductor dies 100a and 100b and the TIV's 404. In the present embodiment, the TIV's 404 extend vertically from an upper surface of the RDL 206 through the insulating material 702 to an upper surface 702s of the insulating material 702. The combination of RDL 206 and TIV's 404 may be referred to as a first redistribution structure. The combination of insulating material 702 and the redistribution structure 704 may be referred to as an insulating structure.

Figure 8:
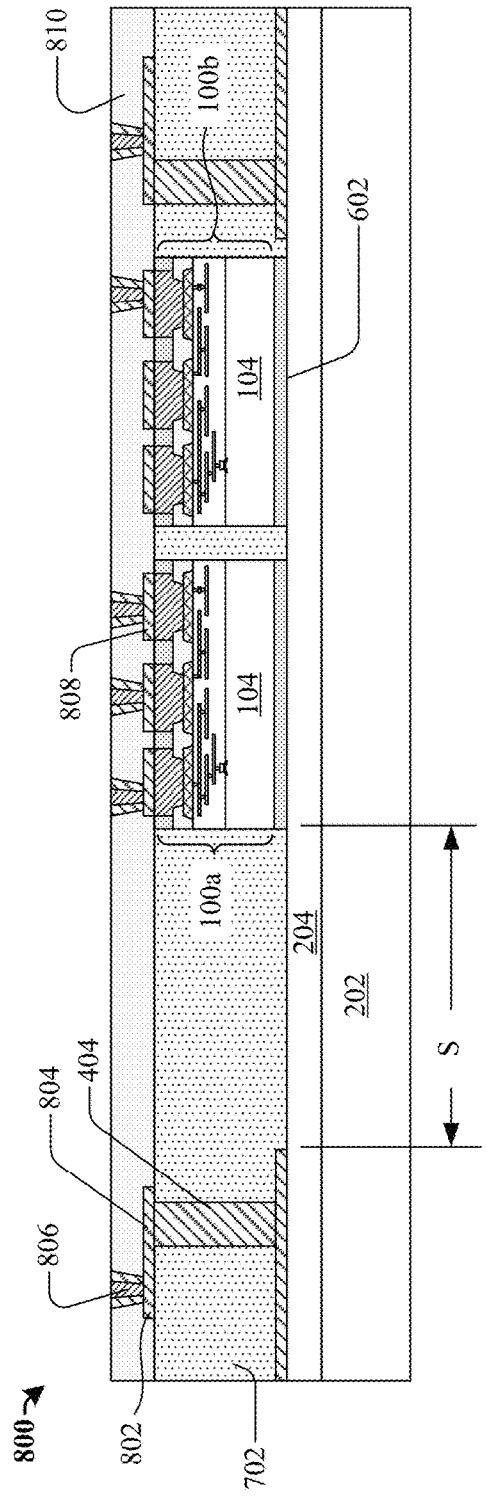

Referring to FIG. 8, an additional RDL 802 is formed over the upper surface of the insulating material 702. The RDL 802 is configured to electrically couple the semiconductor dies 100a and 100b and TIV's 404 with other conductive layers. The RDL 802 may include multiple metal layers, such as layer 804. Each of the metal layers may include conductive wires or lines and is electrically coupled to an adjacent overlaying or underlying metal layer through metal vias, such as via 806. In the present embodiment, a bottom metal layer (e.g., metal layer 804) includes several bond pads 808 electrically coupled to the conductors 110 of the semiconductor dies 100a and 100b. In some embodiments, the metal layer 804 and the via 806 are formed of conductive materials, such as copper, silver, aluminum, gold, tungsten, or combinations thereof. The metal layer 804 and via 806 of the RDL 802 are provided for illustration only. Other numbers of metal layers, vias, or conductive wires and alternative wiring patterns are also within the contemplated scope of the present disclosure.

Moreover, the aforesaid metal layers and metal vias are electrically insulated from other components. The insulation may be achieved by use of an inter-metal dielectric material (IMD) 810. The IMD 810 may be formed of an oxide, such as un-doped silicate glass (USG), fluorinated silicate glass (FSG), borophosphosilicate glass (BPSG), tetraethosiloxane (TEOS), spin-on glass (SOG), high-density plasma (HDP) oxide, plasma-enhanced TEOS (PETEOS), low-k dielectric materials, or the like. The low-k dielectric materials may have k values lower than 3.8, although the dielectric materials may also be close to 3.8. In some embodiments, the k values of the low-k dielectric materials are lower than about 3.0, and may be lower than about 2.5. In accordance with some embodiments, the IMD 810 comprises a polymer material. The formation method of the IMD 810 may include CVD, LPCVD, atmospheric-pressure CVD (APCVD), PECVD, sub-atmospheric CVD (SACVD), ALD, metal organic CVD (MOCVD), PVD, sputtering or other suitable deposition techniques.

Figure 9:
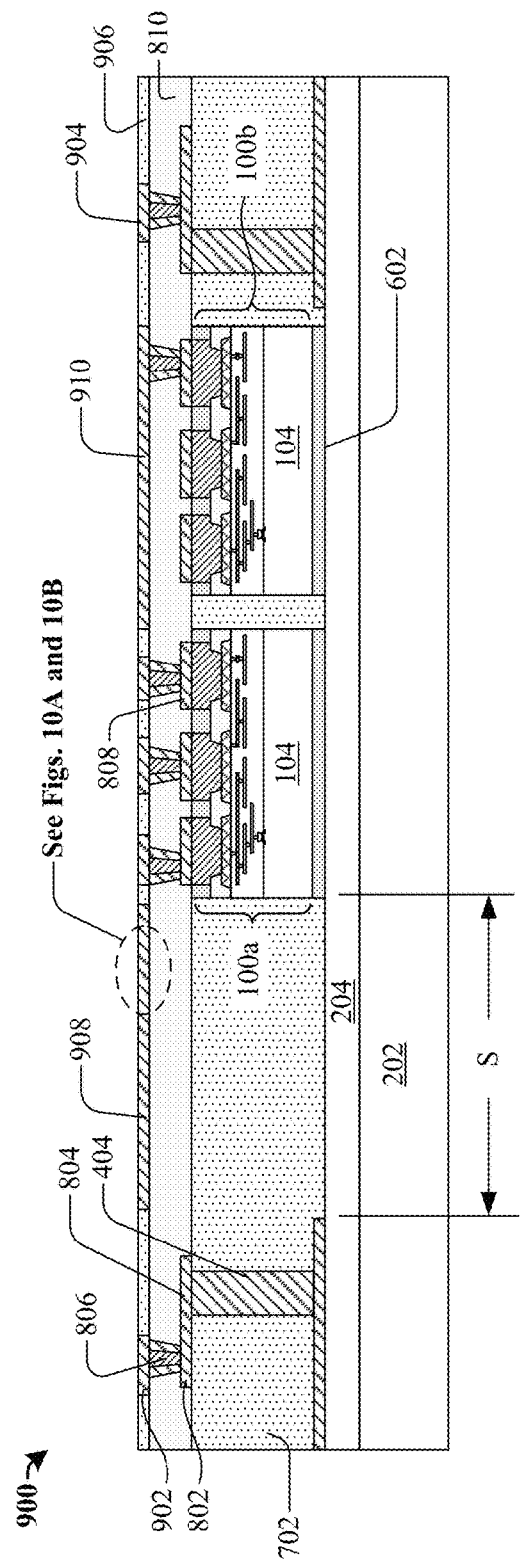

Referring to FIG. 9, another RDL 902 is formed over the RDL 802. The RDL 902 may be configured to electrically couple the RDL 802 with overlaying layers. The RDL 902 may be arranged with different configurations, routing patterns and forming materials dependent upon application needs, and may include a metal layer 904 and an IMD 906. In some embodiments, the RDL 902 is configured similarly to the RDL 802. In some embodiments, the materials and manufacturing methods of the metal layer 904 and the IMD 906 may be similar to those applied to the metal layer 804 and the IMD 810.

Still referring to FIG. 9, conductive layers 908 and 910 are formed in the RDL 902. The conductive layer 908 or 910 is configured as an antenna plane or a ground plane of an antenna, and is electrically coupled to the semiconductor die 100a or 100b. In some embodiments, the conductive layers 908 and 910 have a shape like a plate, a sheet, or a strip. The conductive layer 908 or 910 may be comprised of copper, silver, aluminum, gold, tungsten, or combinations thereof. In some embodiments, the conductive layer 908 or 910 may be formed in conjunction with the metal layer 904 during a single operation. Alternatively, the conductive layer 908 or 910 may be formed prior to or subsequent to the formation of the metal layer 904.

In the present embodiment, the conductive layer 908 may be configured as a ground plane, and in particular may be configured as a striped ground plane.

Figure 10A:
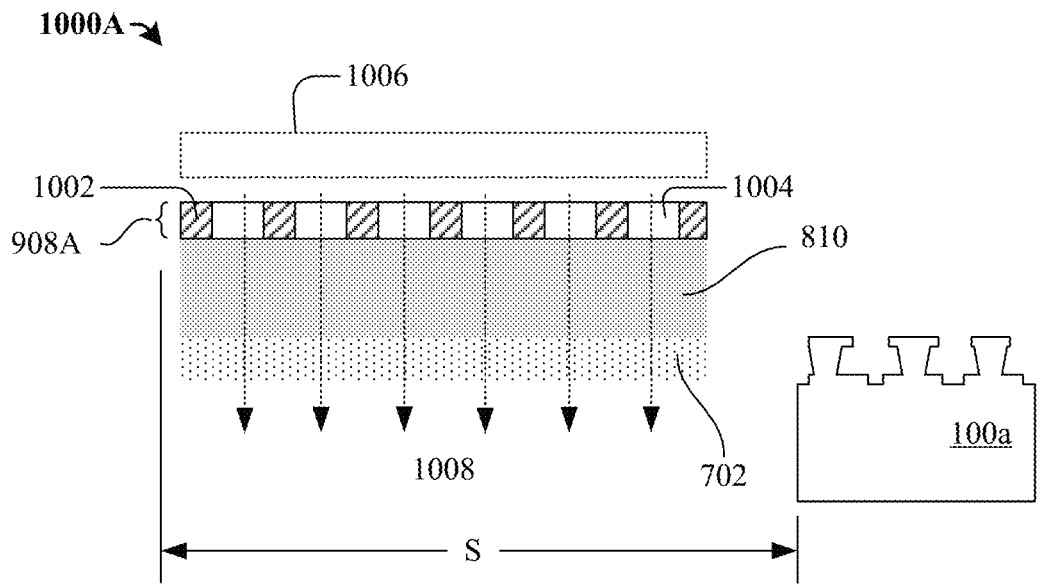

FIG. 10A illustrates an expanded cross-sectional view of some embodiments of the striped ground plane 908A. The striped ground plane 908A comprises regions forming grid lines 1002 from the conductive material deposited in conjunction with or subsequent to forming the metal layer 904 of RDL 902. In between the grid lines are openings 1004 where no conductive material has been deposited, or where it has been etched away after deposition. The openings may be filled with a dielectric material, such as $SiO_2$, low-k dielectric, or high-k dielectric, or an air gap. In some embodiments, the openings 1004 may form a geometric shape, such as slots or other configurations which may be regularly spaced or spaced on a repeating pattern. An antenna 1006 is disposed above and spaced apart from the striped ground plane 908A, and shown in phantom. The antenna 1006 is electrically isolated from the striped ground plane 908A and configured to transmit and receive electromagnetic waves through the openings 1004 in the striped ground plane 908A. In this embodiment, the direction 1008 for transmitting and receiving electromagnetic waves is downward. By laterally offsetting the striped ground plane 908A from the underlying semiconductor die 100a, the antenna's transmitting and receiving of electromagnetic waves occurs through the previously defined space S and is contained within the IMD 810 and the insulating material 702, and avoids passing through the semiconductor die 100a or 100b or other conductive features. This offset provides for improved resistance to antenna-generated electric noise within the semiconductor die, and similarly prevents electrical signals passed within the die from interfering with the antenna operation.

Figure 10B:
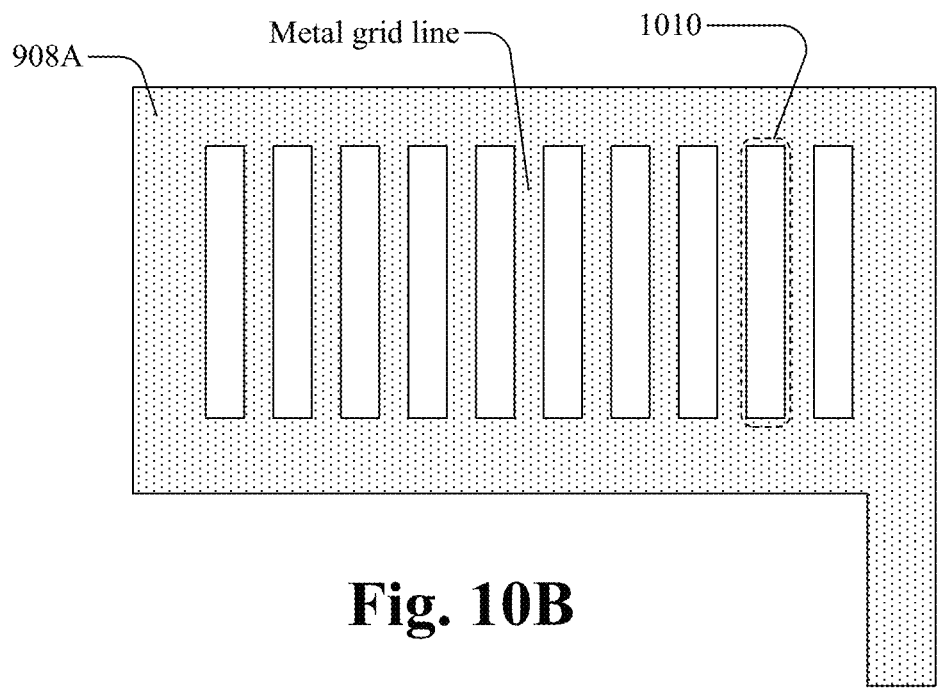

FIG. 10B illustrates some embodiments of a plan view of the striped ground plane 908A. As noted, the striped ground plane 908A may comprise an arrangement of slots 1010 or other geometric shapes forming openings 1004 within the planar conductor material that comprises the conductive layer 908. In some embodiments, the openings 1004 may form regular geometric shapes such as the slots 1010 shown, and may be configured in a repeating and regularly spaced pattern. Many shapes and patterns are possible and may be fabricated by conventional CMOS manufacturing techniques including metal deposition and photolithography or other applicable methods. As such, the configuration of the openings, shapes, and spacing as depicted herein is not limiting to the disclosure.

Figure 11:
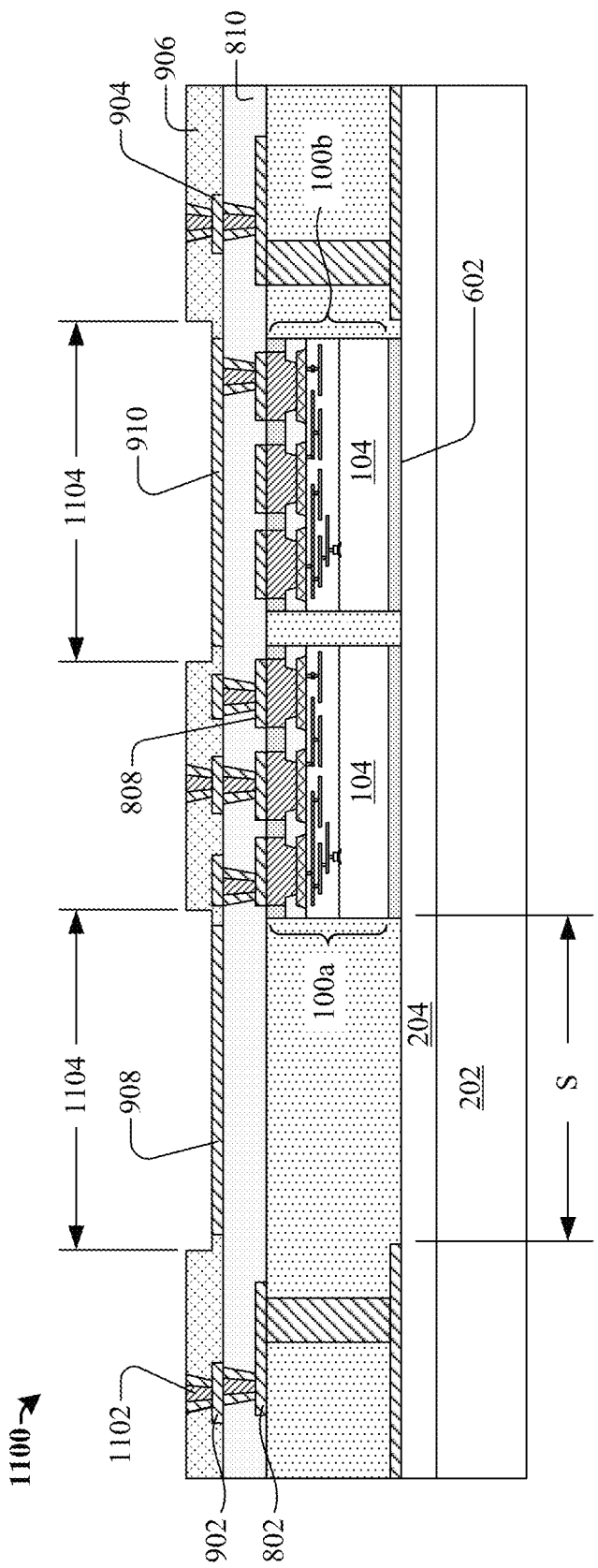

Referring to FIG. 11, an additional layer of the IMD 906 is applied to the as-formed RDL 902. A layer of conductive vias 1102 is then formed in the IMD 906 and electrically coupled to the underlying metal layer 904. Subsequently, the IMD 906 is recessed to expose the conductive layers 908 and 910 through the recesses 1104. The recesses 1104 may be formed using an etching operation, such as a dry etching, a wet etching, or a reactive ionic etching (RIE) operation. In some embodiments, the recess 1104 has a bottom area larger than the area of the conductive layer 908 or 910. In some embodiments, the recess 1104 has a bottom width larger than the width of the conductive layer 908 or 910.

Figure 12:
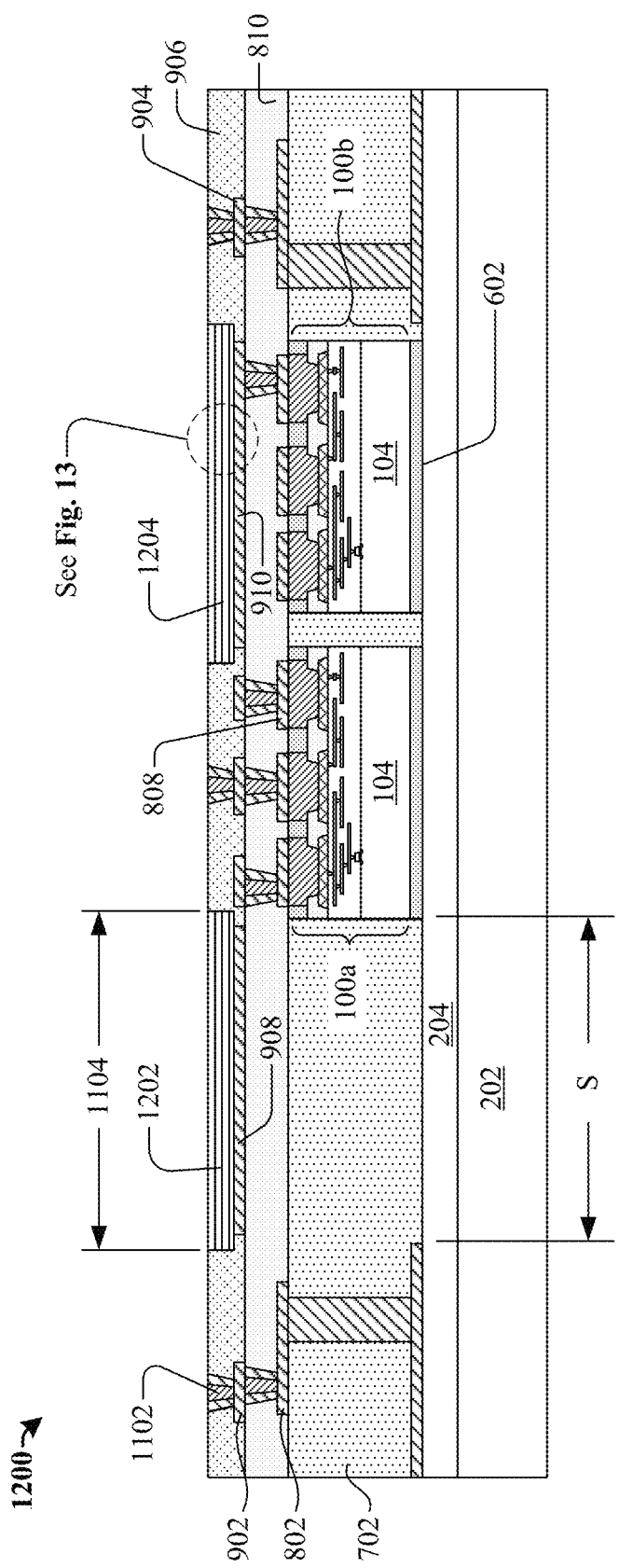

Referring to FIG. 12, the formation of laminated dielectric structures 1202 and 1204 is illustrated and the respective structures are formed within the recesses 1104. The laminated dielectric structure 1202 or 1204 serves as an insulating material between a pair of conductive plates of an antenna, as will be elaborated further in following paragraphs. In some embodiments, the laminated dielectric structures 1202 and 1204 are surrounded by the IMD 906. In some embodiments, the laminated dielectric structure 1202 or 1204 is configured as a resonance cavity for a patch antenna. In order to achieve desired radiation performance, the laminated dielectric structure 1202 or 1204 may contain only dielectric materials and be free from any metal layer or metal via running through the structure. The thickness of the laminated dielectric structure 1202 or 1204 measured in a direction substantially perpendicular to a surface of the RDL 902 is related to a main resonance frequency of the antenna in an end-fire direction. Generally, the greater the dielectric constant of the laminated dielectric structure 1202 or 1204, the lesser the thickness of the laminated dielectric structure. In some embodiments, the conductive via 1102 and the laminated dielectric structure 1202 or 1204 may have substantially equal thicknesses. In some embodiments, the thickness of the laminated dielectric structure 1202 or 1204 is between about 1 μm and about 60 μm. In some embodiments, the thickness of the laminated dielectric structure 1202 or 1204 is between about 1 μm and about 20 μm. In some embodiments, the thickness of the laminated dielectric structure 1202 or 1204 is between about 2 μm and about 5 μm. In some embodiments, the thickness of the laminated dielectric structure 1202 or 1204 is between about 2 μm and about 4 μm.

The formation of the laminated dielectric structure comprising layer upon layer of selected dielectric material films may be accomplished using CVD, LPCVD, APCVD, PECVD, LCVD, MOCVD, SACVD, ALD, PVD, or other suitable deposition operations. The deposition operations may be performed at room temperature. In some embodiments, the deposition operations may be performed below about 250° C. In some embodiments, the deposition operations may be performed below about 200° C.

The laminated dielectric structure 1202 or 1204 may be comprised of layers or films of dielectric materials with a high dielectric constant (high-k). A high-k material may be considered as having a dielectric constant greater than the dielectric constant of the IMD 810 or 906, or greater than a dielectric constant of the insulating material 702. In some embodiments, the high-k material may be considered as having a dielectric constant greater than about 3.8. In some embodiments, the high-k material may be considered as having a dielectric constant greater than about 9.0. In some embodiments, the high-k material may be considered as having a dielectric constant greater than about 80. In some embodiments, the high-k material may be considered as having a dielectric constant greater than about 500. In some embodiments, a ratio of a dielectric constant between the laminated dielectric structure 1202 or 1204 and a dielectric constant of the IMD 810 or 906 is greater than about 20. In some embodiments, a ratio of a dielectric constant between the laminated dielectric structure 1202 or 1204 and a dielectric constant of the IMD 810 or 906 is greater than about 100.

The dielectric materials of the laminated dielectric structure 1202 or 1204 may be comprised of silicon oxide, silicon nitride, silicon oxynitride, metal oxides, metal nitrides, metal silicates, transition metal oxides, transition metal nitrides, transition metal silicates, oxynitrides of metals, metal aluminates, zirconium silicate, zirconium aluminate, or the like. In some embodiments, the laminated dielectric structure 1202 or 1204 may be formed of silicon dioxide, polybenzoxazole (PBO), silicon nitride, $TiO_2$, $SrTiO_3$, $BaSrTiO_3$, $Ba_{x-1}Sr_xTiO_3$, $BaTiO_3$, or $PbZrTiO_3$, $ZrO_2$, $ZrO_xN_y$, $ZrTiO_x$, $ZrSi_xO_y$, $ZrSi_xO_yN_z$, $Al_2O_3$, $HfO_x$, $HfO_xN_y$, $HfSiO_x$, $HfSi_xO_y$, $HfSi_xO_yN_z$, $Ta2O_5$, $TaO_x$, $Ta_xO_y$, $SiN_x$, $SiO_xN_y$, $La_2O_3$, $LaAlO_3$, $CeO_2$, $Bi_4Si_2O_{12}$, WO, $Y_2O_3$, $LaAlO_3$, $PbZrO_3$, $PbZrTiO_3$, lead-strontium-titanate, lead-zinc-niobate, lead-zirconate-titanate, lead-magnesium-niobium, yttria-stabilized zircona, and ZnO/Ag/ZnO, a combination thereof, or the like.

Figure 13:
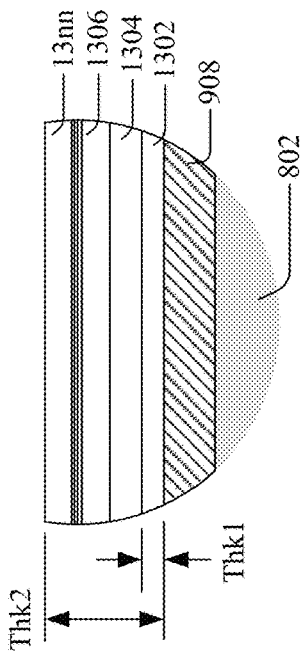

As illustrated in FIG. 13, the laminated dielectric structure 1202 or 1204 includes a multi-layered structure. In some embodiments, the laminated dielectric structure 1202 or 1204 may include at least two layers of different dielectric materials, for example 1302, 1304, and 1306 formed upon one another and having varying dielectric constants including high dielectric constants. In some embodiments, the laminated dielectric structure may include "nn" layers of dielectric materials formed upon one another, for example 1302, 1304, 1306 and so forth through 13nn. In some embodiments, as many as 30 layers of dielectric materials may be employed in forming the laminated dielectric structure. In some embodiments, an individual layer of the laminated dielectric structure may have a thickness Thk1 between about 0.5 μm and 4 μm. In some embodiments, the total thickness Thk2 of the laminated dielectric structure 1202 or 1204 may be between about 1 μm and about 60 μm.

A build-up of the thickness of the laminated dielectric structure 1202 or 1204 using numerous thin films has advantages in mitigating strain build-up that would occur with fewer and thicker layers of dielectric materials conventionally required. Thicker layers of dielectric within a stacked antenna structure may develop strain related cracks in service and fail, whereas multiple thin films may be selected to relieve stress build-up. Similarly, the use of very high dielectric constant materials enables a very thin laminated dielectric structure 1202 or 1204, reducing the height and weight of the semiconductor device package. For example, for a given antenna structure, a laminated dielectric that has a through-thickness effective dielectric constant of about 80, for example $TiO_2$, may have a minimum dielectric layer thickness of about 30-40 μm as applied to 28 GHz to 77 GHz antennas according to the present disclosure. Substituting a dielectric material such as PZT ($PbZrTiO_3$) with a dielectric constant of about 1000 reduces the minimum height requirement to less than 3 μm, or, achieves an order of magnitude reduction in the height of the composite dielectric structure.

In some embodiments, the laminated dielectric structure may be formed of a first sublayer (e.g., 1302) with a dielectric constant greater than 10.0 (e.g., $TiO_2$) and a second sublayer (e.g., 1304) with a dielectric constant less than 4.0 (e.g., PBO). In some embodiments, a sublayer of the laminated dielectric structure 1202 or 1204 may include a material that is a same material as that used in the IMD 810 or 906.

The present disclosure has further advantages relative to existing antennas such as patch antennas. Existing patch antennas are usually disposed on a printed circuit board (PCB) with a large area for the antenna plane or the ground plane. As a result, the capacitance effect becomes more pronounced at high transmission frequencies, e.g., transmission frequencies in the range of tens of GHz. Such inevitable capacitance effect adversely impacts the antenna performance. Moreover, conventional antenna designs adopt a dielectric material of a relatively low dielectric constant as the insulating layer between the pair of conductive plates. The dielectric constant may be as low as 3.8 or below. The resulting antenna performance can achieve a return loss of about −10 dB. In contrast, the proposed laminated dielectric structure comprised of laminated dielectric structures of high-k dielectric materials embedded in an RDL of a package device causes generation of a greater electric field between the pair of the conductive plates. Moreover, the effective high-k value of the laminated dielectric structure leads to a reduced capacitance effect and an improved return loss of −30 dB or better. In addition, the impedance matching circuit can be tuned more easily to achieve better transmission performance.

Figure 14:
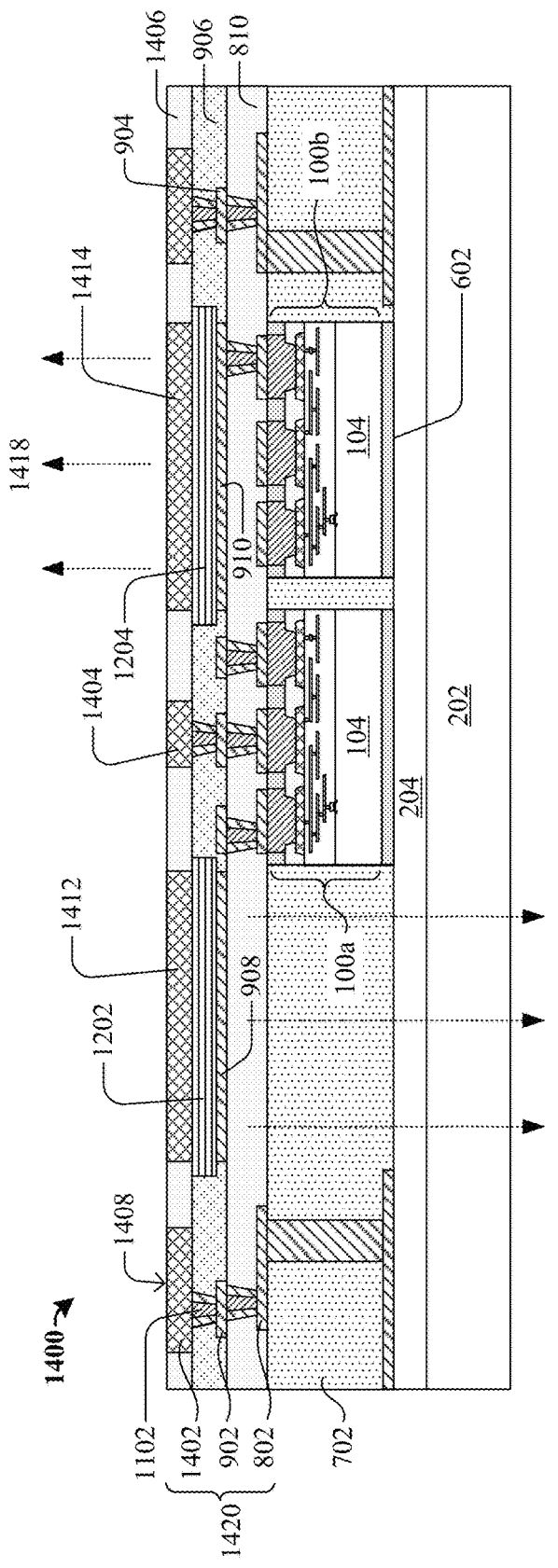

Referring to FIG. 14, still another RDL 1402 is formed over the RDL 902. The RDL 1402 may be configured to electrically couple the RDL 902 with overlaying features. The RDLs 802, 902 and 1402 may be collectively be considered as sublayers of a composite redistribution structure, or a second redistribution structure 1420. The RDL 1402 may be arranged with different configurations, routing patterns and forming materials dependent upon application needs, and may include a metal layer 1404 and the IMD 1406. In some embodiments, the RDL 1402 is configured similarly to the RDL 902 or 802. In some embodiments, the metal layer 1404 is formed of conductive materials, such as copper, silver, aluminum, gold, tungsten, or combinations thereof. The metal layer 1404 and the IMD 1406 may be formed by methods similarly to those applied to the metal layer 904 and the IMD 906. In some embodiments, bond pads 1408 are formed in the RDL 1402 as interconnections electrically coupled to the conductive vias 1102 with overlaying components. The materials and manufacturing method of the bond pads 1408 may be similar to those of the metal layer 1404, and the bond pads 1408 may be formed simultaneously with the metal layer 1404 in some embodiments.

Still referring to FIG. 14, conductive layers 1412 and 1414 are formed in the RDL 1402. In some embodiments, RDL 1402 may be configured as a thicker conductive layer than underlying RDL 902, resulting in conductive layers 1412 and 1414 being substantially thicker than underlying conductive layers 908 and 910. The extra thickness in conductive plates 1412 and 1414 may be exploited in any number of ways to increase or optimize antenna output or performance.

The conductive layer 1412 or 1414 may be configured as an antenna plane or a ground plane, and is electrically coupled to the semiconductor die 100a or 100b. In some embodiments, the ground plane may comprise a striped ground plane. In some embodiments, the conductive layers 1412 and 1414 are formed like plates, sheets, or strips. The conductive layer 1412 or 1414 may be comprised of material such as copper, silver, aluminum, gold, tungsten, or combinations thereof. In some embodiments, the conductive layer 1412 or 1414 may be formed in conjunction with the metal layer 1404 during a single operation. Alternatively, the conductive layer 1412 or 1414 may be formed prior to or subsequent to the formation of the metal layer 1404.

The conductive layers 1412 and 908 are configured as a pair of plates of an antenna structure, such as a micro-strip antenna or a patch antenna, with the laminated dielectric structure 1202 serving as the resonance cavity and insulator thereof. The conductive plates 1412 and 908 may be configured as an antenna plane and a ground plane, respectively, or vice versa, and the ground plane may be configured as a striped ground plane. As shown by the dotted arrows in FIG. 14, when the upper conductive plate 1412 is used as the antenna plane, for example as a patch antenna, the electromagnetic wave resonates within the resonance cavity, i.e., laminated dielectric structure 1202, and radiates through openings in the striped ground plane in a downward direction 1416.

Similarly, in some embodiments, another pair of conductive layers 1414 and 910 form a pair of plates of a second antenna structure with the laminated dielectric structure 1204 serving as the resonance cavity thereof. The conductive plate 910 may serve as the antenna plane to radiate electromagnetic wave upwardly in a direction 1418, and the conductive plate 1414 may be configured as a striped ground plane through which the radiation passes. In some embodiments, the conductive plates 1414 and 910 are exposed from the RDL 1402. In some embodiments, antenna planes from different pairs are integrated as a single antenna. For example, a two-branch antenna may be configured such that the conductive plates 1412 and 908 serve as a first branch while the conductive plates 1414 and 910 serve as a second branch. The two-branch antenna can be integrated to provide enhanced radiation performance.

Figure 15:
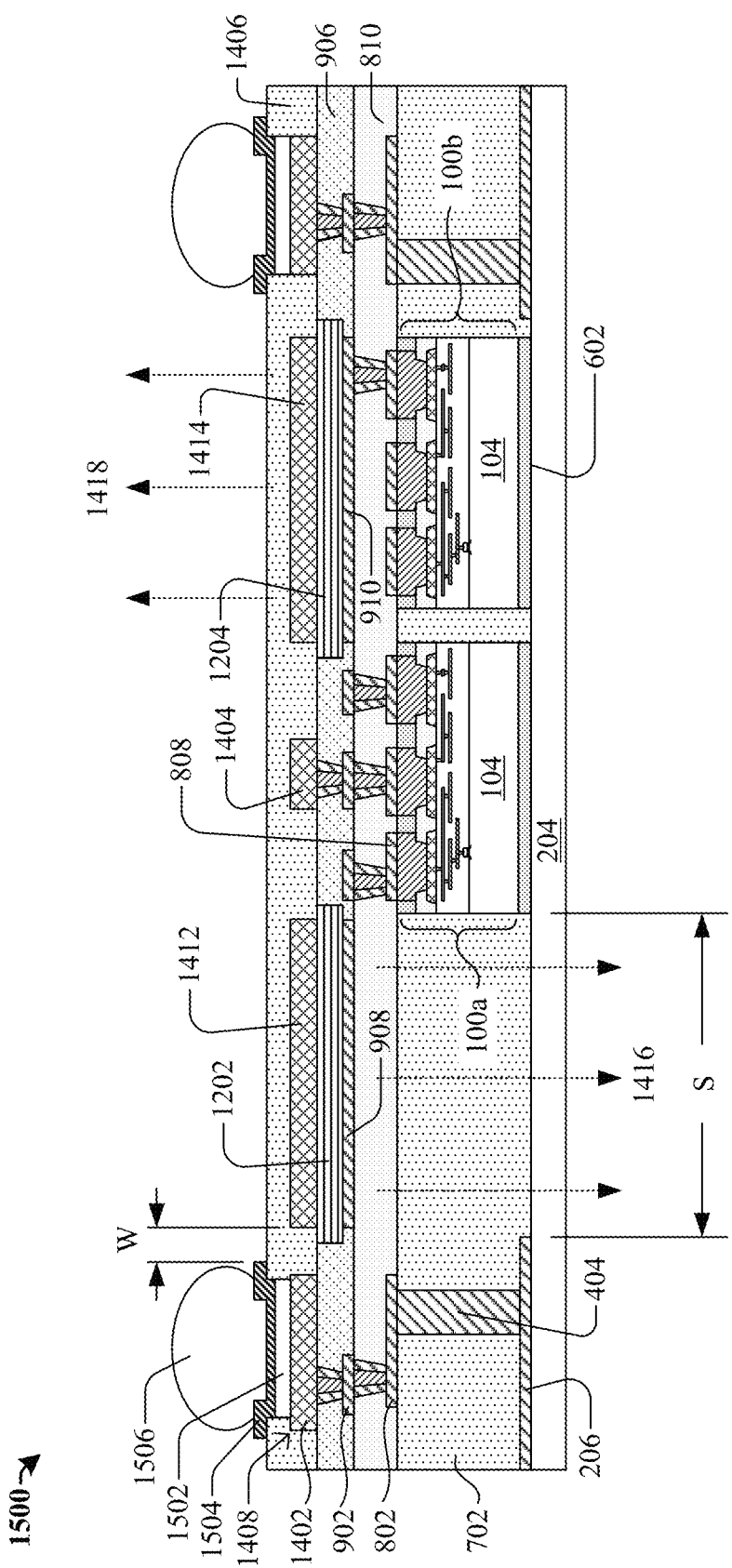

FIG. 15 illustrates a formation of external connectors on the semiconductor device package, Initially, a metallic pillar 1502 and an under bump metallization (UBM) 1504 are sequentially formed over the bond pad 1408. In some embodiments, the metallic pillar 1502 may comprise a single layer or a multilayer structure. For example, the metallic pillar 1502 may comprise copper, cooper alloy, tin, nickel, nickel alloy, combinations, or the like. In some embodiments, the UBM 1504 may comprise a diffusion barrier layer, a seed layer, or a seed layer over a diffusion barrier layer. In some embodiments, the diffusion barrier layer may include titanium, titanium nitride, tantalum, tantalum nitride, or the like. In some embodiments, the seed layer may comprise copper or copper alloys. The metallic pillar 1502 and the UBM 1504 may be formed by CVD, PVD, sputtering or other suitable methods.

Next, a solder material 1506 is formed over the UBM 1504. In some embodiments, the solder material 1506 comprises lead-based materials, such as Sn, Pb, Ni, Au, Ag, Cu, Bi, combinations thereof, or mixtures of other electrically conductive material. In some embodiments, the solder material 1506 is a lead-free material. A thermal process may be performed on the solder material 1506, forming an external connector 1506. In some embodiments, the external connector 1506 comprises a spherical shape. However, other shapes of the external connector 1506 may be also possible. In some embodiments, the external connector 1506 may be contact bumps such as controlled collapse chip connection (C4) bumps, ball grid array bumps, or microbumps.

Referring to FIG. 15, the IMD 1406 may be thickened before the formation of the metallic pillar 1502, the UBM 1504 and the external connector 1506. The thickened IMD 1406 may extend over the conductive plates 1412 and 1414, which is different from the configuration of FIG. 14. In some embodiments, the IMD 1406 covers the top surface of the conductive plate 1412 or 1414. Since the IMD 1406 is not comprised of conductive or semiconductor materials, it can protect the conductive plates 1412 and 1414 from external damage without degrading their radiation performance.

In some embodiments, the external connectors 1506 in conjunction with the metallic pillars 1502 and the UBMs 1504 are disposed spaced apart laterally from the conductive plate 1412 or 1414. In other words, the transmission/receiving path of the conductive plate 1412 or 1414 is clear of conductive or semiconductor features in order to ensure a non-distorted radiation pattern. In some embodiments, a gap W between the conductive plate 1412 and a periphery of the external connector 1506 or UBM 1504 is greater than 10 μm. In some embodiments, the gap W is greater than 50 μm. After the external connector 1506 is formed, the semiconductor package device 1500 is completed and the carrier wafer 202 may be stripped.

In some embodiments, a conductive layer 908 or 910 may be a ground plane, including a striped ground plane, and may be electrically coupled to the semiconductor die 100a or 100b through a bond pad 808. In some embodiments, a subset of the metal layer 804 in the RDL 802 in conjunction with a subset of the vias 806 are used to electrically coupled the ground plane 908 or 910 to the bond pad 808. In some embodiments, the TIV 404 is configured as a grounding path electrically coupled to a ground pad disposed in the RDL 206 or the protection layer 204. The ground plane 908 or 910 may also be electrically grounded through the conductive pillar 404 rather than through the semiconductor die 100a or 100b.

Figure 16:
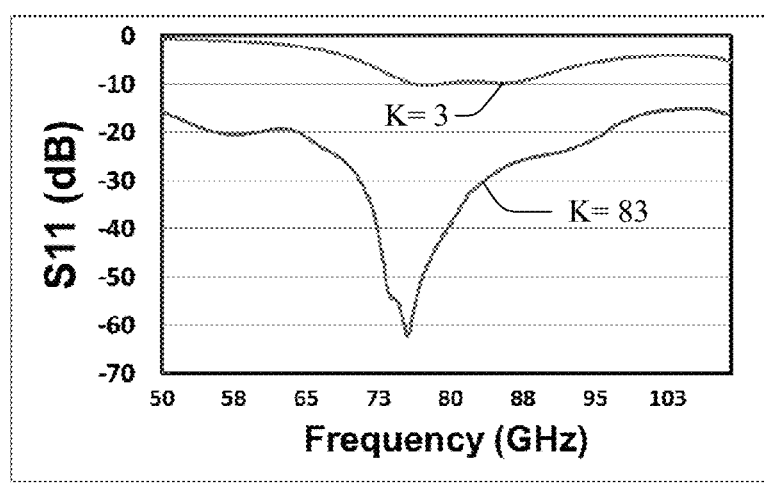
FIG. 16 illustrates a frequency response plot of an antenna structure according to some embodiments of the present disclosure.

FIG. 16 is a schematic diagram of a simulation result for a patch antenna structure configured with different dielectric materials and films and in accordance with some embodiments of the present disclosure. The antenna configuration for the simulation is similar to the structure shown in FIG. 15 with the resonance frequency set at about 77 GHz. A conventional dielectric layer and a laminated high-k dielectric structure are simulated and the performances of their S-parameters S11 (generic representation of a signal return loss) are compared. Referring to FIG. 16, the two lines as labeled represent the simulation results for a conventional dielectric layer with a dielectric constant of around 3.0, and a laminated high-k dielectric structure with an effective dielectric constant of about 83, respectively. As shown in the figure, the conventional dielectric layer configuration with a dielectric constant of 3.0 exhibits a return loss of between −10 dB and 0 dB with a local minimum at around 75-86 GHz. In contrast, the laminated high-k dielectric structure with a dielectric constant of 83 exhibits a signal loss of between −62 dB and −25 dB. Specifically, the laminated high-k dielectric structure provides a sharper frequency selectivity gain at a valley around 76 GHz. Thus, a laminated high-k dielectric structure of dielectric constant as high as 83, which may be practically achieved by the present disclosure, shows a pronounced improvement over a low-k dielectric material of a dielectric constant as low as about 3.0. When using the disclosed laminated high-k dielectric structure, both the average return loss value and the frequency selectivity gain around the specified frequency are enhanced.

Figure 17:
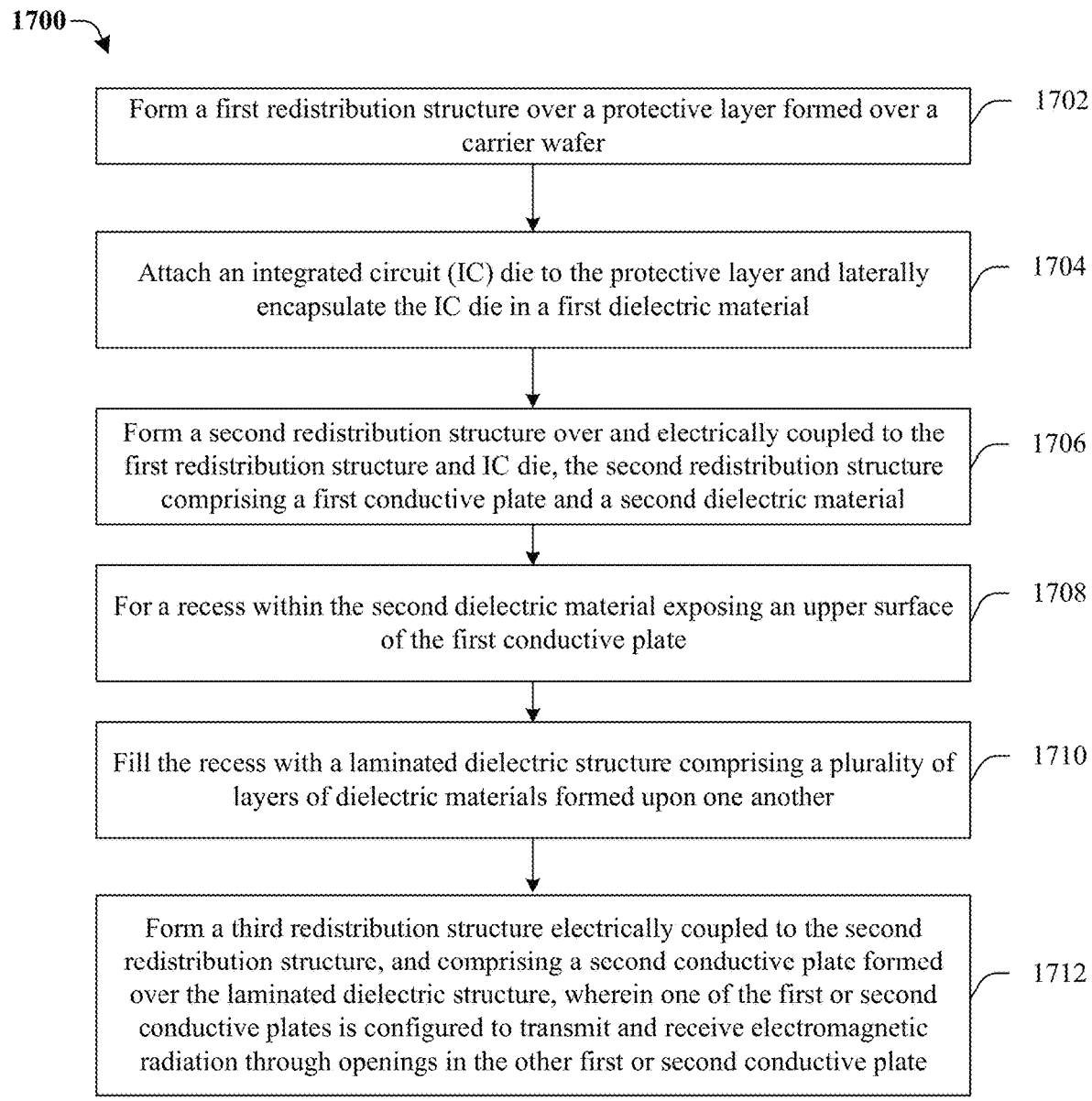
FIG. 17 illustrates a flow diagram of some embodiments of the method of FIGS. 2-15.

With reference to FIG. 17, a flowchart 1700 of some embodiments of the method of FIGS. 2-15 is provided.

At 1702, a first redistribution structure is formed over a protective layer formed over a carrier wafer. FIGS. 2-5 illustrate cross-sectional views corresponding to some embodiments of act 1702.

At 1704, an integrated circuit (IC) die is attached to the protective layer and the IC die is then laterally encapsulate in a first dielectric material. FIGS. 6-7 illustrate cross-sectional views corresponding to some embodiments of act 1704.

At 1706, a second redistribution structure is formed over and electrically coupled to the first redistribution structure and IC die, the second redistribution structure comprising a first conductive plate and a second dielectric material. FIGS. 8-10 illustrate cross-sectional views corresponding to some embodiments of act 1706.

At 1708, a recess is formed within the second dielectric material exposing an upper surface of the first conductive plate. FIG. 11 illustrates a cross-sectional view corresponding to some embodiments of act 1708.

At 1710, the recess is filled with a laminated dielectric structure comprising a plurality of layers of dielectric materials formed upon one another. FIGS. 12-13 illustrate cross-sectional views corresponding to some embodiments of act 1710.

At 1712, a third redistribution structure is formed electrically coupled to the second redistribution structure, and comprising a second conductive plate formed over the laminated dielectric structure. One of the first or second conductive plates is configured to transmit and receive electromagnetic radiation through openings in the other first or second conductive plate. FIGS. 14-15 illustrate cross-sectional views corresponding to some embodiments of act 1712.

While the flowchart 1700 of FIG. 17 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application provide for a semiconductor package device which comprises a semiconductor die. The device further comprises an insulating structure laterally surrounding the die and comprising a first redistribution structure. A second redistribution structure is disposed over the insulating structure and the semiconductor die, and electrically coupled to the first redistribution structure and to the die. The second redistribution structure comprises a first conductive plane and a second conductive plane disposed over one another. The first conductive plane includes openings, and the second conductive plane is configured to transmit and receive electromagnetic waves through the openings. The device further comprises a laminated dielectric structure separating the first and the second conductive planes. The laminated dielectric structure includes a plurality of layers of different dielectric materials disposed upon one another. At least one of the dielectric materials has a dielectric constant higher than that of silicon dioxide.

Other embodiments of the present application provide for a semiconductor package device comprising a semiconductor die. A redistribution structure is disposed over the semiconductor die. The redistribution structure comprises a first pair of an antenna plane and a ground plane disposed over one another and electrically coupled to the semiconductor die. The antenna plane is configured to transmit and receive electromagnetic radiation through openings in the ground plane. A laminated dielectric structure fills a space between the antenna and ground plane. The laminated dielectric structure comprises a plurality of layers of dielectric materials disposed upon one another and having an effective dielectric constant measured perpendicular to the plurality of layers. The redistribution structure further comprises a first dielectric material having a first dielectric constant and encapsulating the antenna, the ground plane, and the laminated dielectric structure. A ratio of the effective dielectric constant to the first dielectric constant is greater than about 20.

Other embodiments of the present application provide for a method of forming an integrated antenna semiconductor package comprising forming a first redistribution structure over a protective layer formed over a carrier wafer. An integrated circuit (IC) die is attached to the protective layer and laterally encapsulated in a first dielectric material. A second redistribution structure is formed over and electrically coupled to the first redistribution structure and IC die. The second redistribution structure comprises a first conductive plate and a second dielectric material. A recess is formed within the second dielectric material exposing an upper surface of the first conductive plate. The recess is filled with a laminated dielectric structure comprising a plurality of layers of dielectric materials formed upon one another. A third redistribution structure is formed electrically coupled to the second redistribution structure, and comprising a second conductive plate formed over the laminated dielectric structure. One of the first or second conductive plates is configured to transmit and receive electromagnetic radiation through openings in the other first or second conductive plate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package device, comprising:
   a semiconductor die;
   a first conductive plane coupled to the semiconductor die, the first conductive plane including a plurality of gaps or slots defined by inner sidewalls of the first conductive plane;
   a second conductive plane disposed over the first conductive plane, the second conductive plane configured to transmit and receive electromagnetic waves through the plurality of gaps or slots; and
   a laminated dielectric structure separating the first conductive plane and the second conductive plane, the laminated dielectric structure comprising a plurality of dielectric layers, wherein a first dielectric layer of the plurality of dielectric layers meets a second dielectric layer of the plurality of dielectric layers at an interface that is disposed between the first conductive plane and the second conductive plane, the first dielectric layer including a first dielectric material and the second dielectric layer including a second dielectric material that is different from the first dielectric material, at least one dielectric material of the first dielectric material and the second dielectric material having a dielectric constant higher than that of silicon dioxide.

2. The semiconductor package device of claim 1, wherein the plurality of dielectric layers comprises one or more of silicon dioxide, polybenzoxazole (PBO), silicon nitride, $TiO_2$, $SrTiO_3$, $BaSrTiO_3$, $Ba_{x-1}Sr_xTiO_3$, $BaTiO_3$, or $PbZrTiO_3$, $ZrO_2$, $ZrO_xN_y$, $ZrTiO_x$, $ZrSi_xO_y$, $ZrSi_xO_yN_z$, $Al_2O_3$, $HfO_x$, $HfO_xN_y$, $HfSiO_x$, $HfSixO_y$, $HfSi_xO_yN_z$, $Ta2O_5$, $TaO_x$, $Ta_xO_y$, $SiN_x$, $SiO_xN_y$, $La_2O_3$, $LaAlO_3$, $CeO_2$, $Bi_4Si_2O_{12}$, WO, $Y_2O_3$, $LaAlO_3$, $PbZrO_3$, $PbZrTiO_3$, lead-strontium-titanate, lead-zinc-niobate, lead-zirconate-titanate, lead-magnesium-niobium, yttria-stabilized zircona, and ZnO/Ag/ZnO.

3. The semiconductor package device of claim 1, wherein a layer of the plurality of layers has a thickness of about 0.5 to about 4 microns, and wherein the plurality of layers has a total thickness of about 1 to about 60 microns.

4. The semiconductor package device of claim 1, wherein the first conductive plane is configured as a ground plane, and the second conductive plane is configured as an antenna.

5. The semiconductor package device of claim 4, wherein the antenna comprises a patch antenna array of one or more patch antennas arranged within an area of about 5 mm by 5 mm, and wherein the antenna has an area of about 1 mm by 1 mm.

6. The semiconductor package device of claim 5, wherein the patch antenna array is configured for a resonant frequency of about 20 GHz to about 80 GHz.

7. The semiconductor package device of claim 4, wherein the plurality of gaps or slots in the first conductive plane comprise an arrangement of repeating geometric shapes spaced between contiguous sections of a conductor layer, and wherein the arrangement of repeating geometric shapes align over a radiating and receiving surface of the second conductive plane.

8. The semiconductor package device of claim 7, wherein the laminated dielectric structure has a surface area larger than a surface area of the first conductive plane or the second conductive plane.

9. The semiconductor package device of claim 4, further comprising:
   an insulating structure laterally surrounding the semiconductor die and comprising a first redistribution structure arranged within the insulating structure;
   a second redistribution structure disposed over the insulating structure and the semiconductor die, and electrically coupled to the first redistribution structure and to the semiconductor die; and
   a third redistribution structure electrically coupled to the second redistribution structure, the third redistribution structure comprising vias electrically coupled to contact pads arranged on exterior surfaces of the semiconductor package device.

10. The semiconductor package device of claim 9, wherein the insulating structure is substantially free of conductive or semiconductor materials within portions directly below the first conductive plane and the second conductive plane.

11. The semiconductor package device of claim 9, wherein the first redistribution structure further comprises a through insulator via (TIV) electrically coupling the first redistribution structure to the second redistribution structure.

12. A semiconductor package device comprising:
   a semiconductor die;
   a first ground plane in a first metal layer of the semiconductor package device, the first ground plane electrically coupled to the semiconductor die, and the first ground plane including a plurality of openings defined by inner sidewalls of the first ground plane;
   a first antenna plane in a second metal layer of the semiconductor package device, the first antenna plane being disposed over the first ground plane and configured to transmit and receive electromagnetic radiation through the plurality of openings in the first ground plane;
   a first laminated dielectric structure separating the first ground plane and the first antenna plane, the first laminated dielectric structure comprising a plurality of layers of dielectric materials disposed upon one another and having an effective dielectric constant; and
   a first dielectric material having a first dielectric constant and encapsulating the first ground plane, the first antenna plane, and the first laminated dielectric structure, wherein a ratio of the effective dielectric constant to the first dielectric constant is greater than about 20;
   a redistribution structure disposed over the semiconductor die; and an external connector on an external surface of the redistribution structure, wherein the external connector is laterally spaced apart from the first ground plane and the first antenna plane.

13. The semiconductor package device of claim 12, further comprising:
a second ground plane disposed in the second metal layer, the second ground plane electrically coupled to the semiconductor die, and the second ground plane including a plurality of gaps or slots defined by inner sidewalls of the second ground plane;
a second antenna plane disposed in the first metal layer, the second antenna plane configured to transmit and receive electromagnetic radiation through the plurality of gaps or slots in the second ground plane; and
a second laminated dielectric structure separating the second ground plane from the second antenna plane, wherein the second antenna plane and the second ground plane are disposed on a side of the semiconductor die opposite the first antenna plane and the first ground plane.

14. The semiconductor package device of claim 13, wherein the redistribution structure further comprises a third antenna plane and a third ground plane and a fourth antenna plane and a fourth ground plane electrically coupled to the semiconductor die, wherein the first, second, third, and fourth antenna planes and ground planes are arranged in a fanned-out array viewed from above with the semiconductor die disposed at a center of the fanned-out array.

15. The semiconductor package device of claim 12, wherein the semiconductor die is laterally spaced apart from the first antenna plane and the first ground plane.

16. A semiconductor package device including an antenna patch array, comprising:
a semiconductor die;
four pairs of conductive plates, including a first pair, second pair, third pair, and fourth pair, disposed around outer edges of the semiconductor die, such that the semiconductor die is centered within the four pairs of conductive plates;
four antenna branches coupling the semiconductor die to the four pairs of conductive plates, respectively; and
a laminated dielectric structure separating upper and lower plates in each of the four pairs of conductive plates from one another, the laminated dielectric structure comprising first and second dielectric layers made of first and second dielectric materials, respectively, wherein the first and second dielectric materials are different from one another and at least one of the first and second dielectric materials has a dielectric constant higher than that of silicon dioxide.

17. The semiconductor package device of claim 16, wherein an upper plate of the first pair is a conductive ground plane including a plurality of gaps or slots therein; and
wherein a lower plate of the first pair is a conductive antenna plane, the conductive antenna plane configured to transmit and receive electromagnetic waves through the plurality of gaps or slots in the upper plate of the first pair.

18. The semiconductor package device of claim 17, wherein an upper plate of the second pair is a conductive ground plane including a plurality of gaps or slots therein; and
wherein a lower plate of the second pair is a conductive antenna plane, the conductive antenna plane configured to transmit and receive electromagnetic waves through the plurality of gaps or slots in the upper plate of the second pair.

19. The semiconductor package device of claim 16, wherein the first dielectric material comprises one or more of polybenzoxazole (PBO), silicon nitride, $TiO_2$, $SrTiO_3$, $BaSrTiO_3$, $Ba_{x-1}Sr_xTiO_3$, $BaTiO_3$, or $PbZrTiO_3$, $ZrO_2$, $ZrO_xN_y$, $ZrTiO_x$, $ZrSi_xO_y$, $ZrSi_xO_yN_z$, $Al_2O_3$, $HfO_x$, $HfO_xN_y$, $HfSiO_x$, $HfSixO_y$, $HfSi_xO_yN_z$, $Ta2O_5$, $TaO_x$, $Ta_xO_y$, $SiN_x$, $SiO_xN_y$, $La_2O_3$, $LaAlO_3$, $CeO_2$, $Bi_4Si_2O_{12}$, WO, $Y_2O_3$, $LaAlO_3$, $PbZrO_3$, $PbZrTiO_3$, lead-strontium-titanate, lead-zinc-niobate, lead-zirconate-titanate, lead-magnesium-niobium, yttria-stabilized zircona, and ZnO/Ag/ZnO.

\* \* \* \* \*